United States Patent
Yamane

(10) Patent No.: US 7,539,925 B2
(45) Date of Patent: May 26, 2009

(54) TRANSMISSION APPARATUS AND METHOD, RECEPTION APPARATUS AND METHOD, STORAGE MEDIUM, AND PROGRAM

(75) Inventor: Kenji Yamane, Tokyo (JP)

(73) Assignee: Sony Corporation, Tokyo (JP)

( * ) Notice: Subject to any disclaimer, the term of this patent is extended or adjusted under 35 U.S.C. 154(b) by 582 days.

(21) Appl. No.: 10/999,980

(22) Filed: Dec. 1, 2004

(65) Prior Publication Data

US 2005/0160346 A1 Jul. 21, 2005

(30) Foreign Application Priority Data

Dec. 10, 2003 (JP) .............................. 2003-412459

(51) Int. Cl.
*H03M 13/35* (2006.01)

(52) U.S. Cl. ...................................... 714/774; 714/776

(58) Field of Classification Search ................. 714/774, 714/776

See application file for complete search history.

(56) References Cited

U.S. PATENT DOCUMENTS

| | | | | |
|---|---|---|---|---|
| 5,313,454 A * | 5/1994 | Bustini et al. | ................ | 370/231 |
| 5,426,635 A * | 6/1995 | Mitra et al. | ................... | 370/229 |
| 5,696,764 A * | 12/1997 | Soumiya et al. | ......... | 370/395.41 |
| 5,699,345 A * | 12/1997 | Watanuki et al. | ............. | 370/232 |
| 5,732,078 A * | 3/1998 | Arango | ........................ | 370/355 |
| 5,856,988 A | 1/1999 | Kiriyama | | |
| 5,936,958 A * | 8/1999 | Soumiya et al. | ......... | 370/395.43 |
| 6,061,820 A * | 5/2000 | Nakakita et al. | ............. | 714/751 |
| 6,310,857 B1 * | 10/2001 | Duffield et al. | .............. | 370/232 |
| 6,424,624 B1 * | 7/2002 | Galand et al. | ................ | 370/231 |
| 6,643,256 B1 * | 11/2003 | Shimojo et al. | .............. | 370/229 |
| 6,882,624 B1 * | 4/2005 | Ma | .......................... | 370/236.1 |
| 6,996,097 B1 * | 2/2006 | Chou et al. | .................. | 370/389 |
| 7,035,220 B1 * | 4/2006 | Simcoe | ....................... | 370/236 |
| 7,095,729 B2 * | 8/2006 | Sachs et al. | .................. | 370/341 |
| 7,099,273 B2 * | 8/2006 | Ha et al. | ...................... | 370/229 |
| 2005/0076272 A1 | 4/2005 | Delmas et al. | | |
| 2008/0031179 A1 | 2/2008 | Gao et al. | | |

FOREIGN PATENT DOCUMENTS

| | | |
|---|---|---|
| EP | 0 713 302 A2 | 5/1996 |
| JP | 11-239159 | 8/1999 |

(Continued)

OTHER PUBLICATIONS

Schuichi Takayama, et al. "FEC System for Real-Time Communication," Technical Report IN95-5, vol. 95, No. 28 (With English Abstract) The Institute of Electronics, Information and Communication Engineers (IEICE). Tokyo, Japan: May 12, 1995.

*Primary Examiner*—Stephen M Baker
(74) *Attorney, Agent, or Firm*—Oblon, Spivak, McClelland, Maier & Neustadt, P.C.

(57) ABSTRACT

A congestion/non-congestion determining unit determines whether or not a communications network is in a congestion state. An FEC (forward error correction) packet generator generates error correction packets containing error correction data for correcting error of streaming data contained in transmission packets. When the determination result changes from a non-congestion state to a congestion state, an FEC transmission controller controls the error-correction-packet generation so as to change the number of error correction packets. The present invention is applicable to a remote TV conference system.

12 Claims, 22 Drawing Sheets

FOREIGN PATENT DOCUMENTS

| | | |
|---|---|---|
| JP | 2003-179580 | 6/2003 |
| JP | 2003-529289 | 9/2003 |
| JP | 2005-515697 | 5/2005 |
| JP | 2007-510363 | 4/2007 |
| WO | WO 01/74012 | 10/2001 |

* cited by examiner

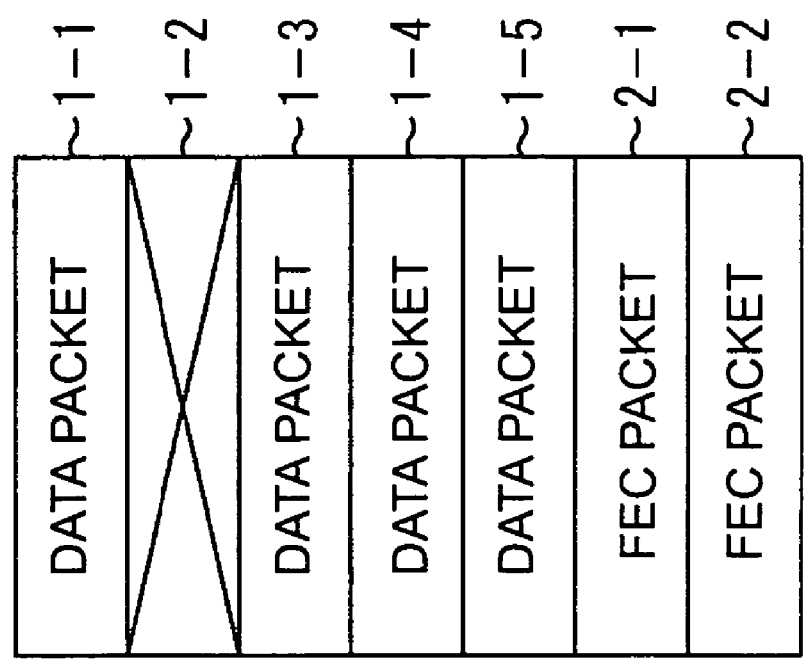
FIG. 1
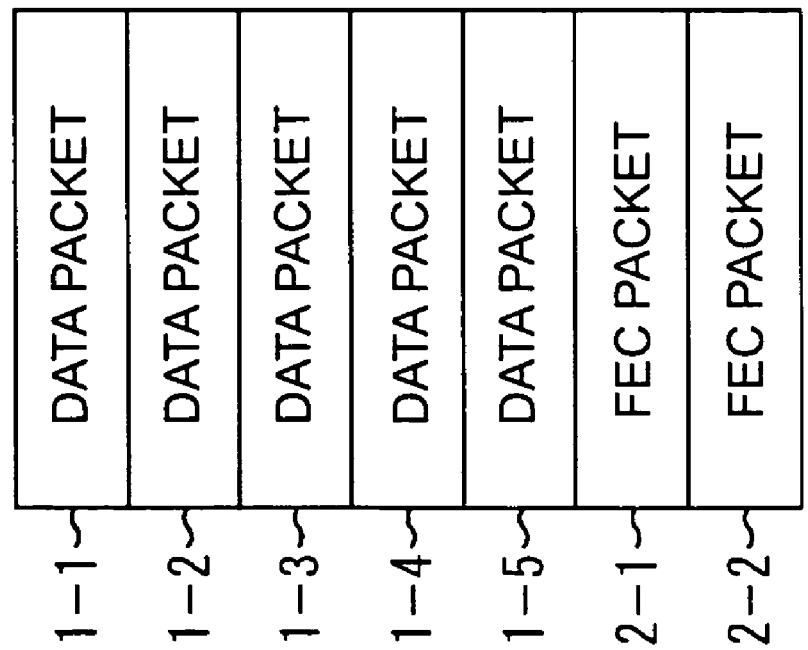

FIG. 9

| FEC BLOCK ID | NUMBER OF ORIGINAL DATA PACKETS | TOTAL NUMBER OF PACKETS | NUMBER OF RECEPTION PACKETS | FEC BLOCK STATE |
|---|---|---|---|---|
| 1 | 4 | 6 | 4 | ADEQUATE STATE |
| 2 | 4 | 6 | 3 | SHORTAGE STATE |
| 3 | 4 | 6 | 6 | EXCESS STATE |
| | | | | |
| | | | | |
| | | | | |

FIG. 14

| V | P | Sub | PT=205 | Message Length |
|---|---|---|---|---|
| | | | SSRC | |
| | | | NAME | |
| | | | TRANSMISSION TIME | |

FIG. 19

| V | P | Sub | PT=204 | Message Length |
|---|---|-----|--------|----------------|
| | | | SSRC | |
| | | | NAME | |
| | | | NOTIFICATION FEC STATE | |

TRANSMISSION APPARATUS AND METHOD, RECEPTION APPARATUS AND METHOD, STORAGE MEDIUM, AND PROGRAM

BACKGROUND OF THE INVENTION

1. Field of the Invention

The present invention relates to transmission apparatuses and methods, reception apparatuses and methods, storage media, and programs. More particularly, the present invention relates to a transmission apparatus and a method therefor, a reception apparatus and a method therefor, a recording medium, and a program which allow data containing redundant data to be more efficiently transmitted in accordance with the state of a communications network.

2. Description of the Related Art

Nowadays, services that are provided through transmission of video data or audio data via various communication media, such as the Internet, are widely available. In recent years, particularly, in addition to services using a download transmission scheme, services using a streaming transmission scheme are increasingly becoming popular.

In the streaming transmission services, a transmission apparatus sequentially transmits data and a reception apparatus receives the data transmitted from the transmission apparatus and simultaneously plays back video or audio based on the received data. The streaming transmission scheme is typically applied to Internet telephones, remote TV conference services, and internet-based services such as video-on-demand services.

In the streaming transmission scheme, data transmitted from a transmission apparatus is commonly referred to as "streaming data".

When moving-image streaming data or audio streaming data is transmitted through a transmission path, such as the Internet, that does not guarantee the arrival of the data, packet loss can occur due to an increased transmission load.

As a result of the packet loss, the receiving side suffers from disturbance of moving-image data played back and/or interruption of audio played back.

To solve the problem, a method in which redundant data is transmitted together with the streaming data to allow the receiving side correct error of lost packets has been used. One example is an FEC (forward error correction) scheme. In the FEC scheme, a plurality of redundant packets are generated for a group of packets and are transmitted together with the group of packets. When any packet is lost from packets belonging to the group, the receiving side uses the redundant packets to correct error for the lost packet(s).

For example, as shown in FIG. 1, a transmitting side adds two redundant packets, i.e., FEC packets 2-1 and 2-2 to a group of five packets, i.e., data packets. 1-1 to 1-5 and transmits the resulting packets to a receiving side. The FEC packets 2-1 and 2-2 are generated by performing an exclusive-OR (XOR) operation on a given combination of the data packets 1-1 to 1-5.

For example, when the data packet 1-2 is lost on a transmission path, the receiving side performs an XOR operation on the data packet 1-1 and the FEC packet 2-1 to recover the data packet 1-2.

In the example shown in FIG. 1, error of lost packets the number of which being equal to the number of FEC packets 2-1 and 2-2 can be corrected. That is, when one or two of the data packets 1-1 to 1-5 are lost, the packet(s) can be recovered.

An FEC scheme may be used to generate redundant data for a group for one frame. However, when software is used to generate the redundant data, there is a problem in that a considerably high load is put on the processing.

FIG. 2 illustrates the sequence of transmission of the group of the data packets 1-1 to 1-5 and the redundant packets of the FEC packets 2-1 and 2-2. The horizontal direction in FIG. 2 indicates time.

For transmission of the group of the data packets 1-1 to 1-5 and the redundant packets of the FEC packets 2-1 and 2-2, first, the data packets 1-1 to 1-5 are sequentially transmitted and then the FEC packets 2-1,and 2-2 are sequentially transmitted.

FIG. 3 is a flow chart showing known processing for transmitting packets with FEC packets. In step S11, the transmission apparatus initializes an internal timer.

In step S12, based on the timer value, the transmission apparatus determines whether or not the timer has expired. When the timer has not expired, the determination processing in step S12 is repeated until when the timer expires.

When it is determined that the timer has expired in step S12, this means that a period of time corresponding to one frame has elapsed. The process then proceeds to step S13, in which the transmission apparatus captures video data supplied. In step S14, the transmission apparatus encodes the captured image data.

In step S15, the transmission apparatus generates RTP (real-time transport protocol) packets, which are data packets that contain the encoded video data. In step S16, the transmission apparatus transmits the;RTP packets to a receiving side.

In step S17, based on the RTP packets, the transmission apparatus generates an FEC packet. In step S18, the transmission apparatus transmits the FEC packet to the receiving side.

In step S19, the transmission apparatus updates a timestamp added to the RTP packets. In step S20, the transmission apparatus sets the internal timer. The process then returns to step S12 and the above-described processing is repeated.

Japanese Unexamined Patent Application Publication No. 2000-224226 discloses a related technology. A transmitting side generates an information block of each packet so that the block has a portion common to the information blocks of a preceding packet and a subsequent packet, encodes the information block by error correction coding, and transmits the encoded information block. The size of the common portion is varied depending on the state of a transmission path. A receiving side, on the other hand, corrects error of the information block by using decode and error correction functions. When the receiving side fails in decoding, it replaces the common portion of the information block with the common portion of the preceding packet and performs decoding and error correction again on the information block in which the common portion has been replaced.

Japanese Unexamined Patent Application Publication No. 2003-179580 discloses a system for performing error correction control based on the state of a network monitored by a network monitoring unit during packet transmission. This system executes packet transfer by dynamically changing modes, such as error control based on an FEC scheme or error correction based on playback request processing (ARQ: automatic repeat request), in accordance with packet loss and error occurrence state in the network. For example, when the RTT (round-trip time) is short, the system selects the ARQ-based error correction, and when the RTT is long, the system selects the FEC-based error correction, thereby allowing dynamic error-correction control.

However, always transmitting redundant packets together with streaming data involves transmission of unwanted data.

In addition, since how much packet loss is occurring cannot be figured out in the network, the known approaches have a problem in determination as to how many redundant packets are to be transmitted.

SUMMARY OF THE INVENTION

One aspect of the present invention provides a transmission apparatus for transmitting transmission packets containing streaming data over a communications network. The transmission apparatus includes determining means for determining whether or not the communications network is in a congestion state and generating means for generating error correction packets containing error correction data for correcting error of the streaming data. The transmission apparatus further includes controlling means for controlling the error-correction-packet generation performed by the generating means so as to change the number of error correction packets, when a result of the determination changes from a non-congestion state to a congestion state.

When it is determined that the communications network is in a congestion station, the controlling means may perform the control so as to cause the generating means to generate a predetermined number of error correction packets. When it is determined that the communications network is not in a congestion state, the controlling means may perform the control so as to suppress the error-correction-packet generation performed by the generating means.

When the result of the determination changes from a non-congestion state to a congestion state, the controlling means may perform the control so as to change the number of error correction packets, in accordance with a reception state of the transmission packets in an immediately previous congestion state.

At least one of the transmission packets may define one error correction unit in a predetermined period of time when the number of error correction packets in one or more of the error correction units is determined to be insufficient in the predetermined period of time in accordance with a state of reception of the one or more error correction units in the predetermined period of time, the controlling means may perform the control so as to increase the number of error correction packets.

The determining means may determine whether or not the communications network is in a congestion state, in accordance with short-range dependent delay time and long-range dependent delay time, the short-range dependent delay time depends on delay time required for transmitting the transmission packets to a receiving side in a period from first time to current time and the long-range dependent delay time depends on delay time required for transmitting the transmission packets to the receiving side in a period from the first time to second time that is earlier than the first time.

Another aspect of the present invention provides a transmission method for transmitting transmission packets containing streaming data over a communications network. The method includes a determining step of determining whether or not the communications network is in a congestion state and a generating step of generating error correction packets containing error correction data for correcting error of the streaming data. The method further includes a controlling step of controlling the error-correction-packet generation performed by the generating means so as to change the number of error correction packets, when a result of the determination changes from a non-congestion state to a congestion state.

Another aspect of the present invention provides a storage medium that records a computer-readable program for transmission processing for transmitting transmission packets containing streaming data over a communications network. The computer-readable program includes a determining step of determining whether or not the communications network is in a congestion state and a generating step of generating error correction packets containing error correction data for correcting error of the streaming data. The program further includes a controlling step of controlling the error-correction-packet generation performed by the generating means so as to change the number of error correction packets, when a result of the determination changes from a non-congestion state to a congestion state.

Further aspect of the present invention provides a program for causing a computer to perform transmission processing for transmitting transmission packets containing streaming data over a communications network. The program includes a determining step of determining whether or not the communications network is in a congestion state and a generating step of generating error correction packets containing error correction data for correcting error of the streaming data. The program further includes a controlling step of controlling the error-correction-packet generation performed by the generating means so as to change the number of error correction packets, when a result of the determination changes from a non-congestion state to a congestion state.

The transmission apparatus may be an independent apparatus or may be a block provided in a communication apparatus to perform transmission processing.

Another aspect of the present invention provides a reception apparatus for receiving transmission packets containing streaming data over a communications network. The reception apparatus includes reception controlling means for receiving error correction packets containing error correction data for correcting error of the streaming data and determining means for determining whether or not the number of received error correction packets is adequate for correcting the error of the streaming data.

The determining means may determine whether the number of received error correction packets is insufficient, adequate, or excessive for correcting the error of the streaming data.

The determining means may determine whether the number of received error correction packets is insufficient, adequate, or excessive for correcting the error of the streaming data, for each error correction unit defined by at least one of the transmission packets. The reception apparatus may further includes setting means for performing setting such that a notification to be transmitted to a receiving side indicates a shortage of the error correction packets, when the number of error corrections packets in one or more of the error correction units is determined to be insufficient in a predetermined period of time in accordance with the result of the determination for the one or more of the error correction units in the predetermined period of time.

The reception apparatus may further include generating means for generating a feedback packet containing a notification based on a result of the determination and transmission controlling means for controlling transmission of the feedback packet generated by the generating means to a receiving side.

Still another aspect of the present invention provides a reception method for receiving transmission packets containing streaming data over a communications network. The method includes a reception controlling step of receiving error correction packets containing error correction data for correcting error of the streaming data and a determining step of determining whether or not the number of error correction packets received in the reception controlling step is adequate for correcting the error of the streaming data.

Another aspect of the present invention provides a storage medium that records a computer-readable program for reception processing for receiving transmission packets containing streaming data over a communications network. The computer-readable program includes a reception controlling step of receiving error correction packets containing error correction data for correcting error of the streaming data and a determining step of determining whether or not the number of error correction packets received in the reception controlling step is adequate for correcting the error of the streaming data.

Yet another aspect of the present invention provides a program for causing a computer to perform reception processing for receiving transmission packets containing streaming data over a communications network. The program includes a reception controlling step of receiving error correction packets containing error correction data for correcting error of the streaming data and a determining step of determining whether or not the number of error correction packets received in the reception controlling step is adequate for correcting the error of the streaming data.

The reception apparatus may be an independent apparatus or may be a block provided in a communication apparatus to perform reception processing.

According to the transmission apparatus and method, recording medium, and program, a determination is made as to whether or not the communications network is in a congestion state, and error correction packets containing error correction data for correcting error of streaming data contained in transmission packets are generated. When the result of the determination changes from a non-congestion state to a congestion state, the generation of the error correction packets is controlled such that the number of error correction packets is changed.

According to the reception apparatus, method, recording medium, and program, error correction packets containing error correction data for correcting error of streaming data contained in transmission packets are received and a determination is made as to whether or not the number of received error correction packets is adequate for correcting the error of the streaming data.

According to the present invention, since error correction packets are generated, redundant data for error correction can be transmitted. Further, according to the present invention, a determination is made as to whether or not the communications network is in a congestion state and error correction packets are generated. When the result of the determination changes from a non-congestion state to a congestion state, the packet generation is controlled such that the number of error correction packets is changed. This allows data containing redundant data to be more efficiently transmitted depending on the state of the communications network.

According to the present invention, since error correction packets are received, error of data received can be corrected. According to the present invention, error correction packets are received and a determination is made as to whether or not the number of received error correction packets is adequate for correcting error of streaming data. As a result, the transmitting side can efficiently transmit data containing redundant data, depending on the state of the communications network.

BRIEF DESCRIPTION OF THE DRAWINGS

FIG. 1 illustrates known transmission of FEC packets;
FIG. 9 illustrates FEC block information;
FIG. 14 illustrates an RTT measurement packet;
FIG. 19 illustrates the FEC feedback packet.

DESCRIPTION OF THE PREFERRED EMBODIMENTS

Before describing embodiments of the present invention, the relationship between the aspects described herein and the embodiments of the present invention is briefly explained. That is, this description is intended to confirm that embodiments supporting the present invention described herein are included herein. Accordingly, even if any embodiment or example that is described herein but is not associated with an aspect of the present invention exists, it does not mean that such an embodiment or example does not cover the aspect of the present invention. Conversely, even if an embodiment is described so as to correspond to an aspect of the present invention, it should not be construed that the embodiment does not correspond to any other aspect of the present invention.

In addition, this description does not represent all aspects of the present invention disclosed herein. In other words, the description herein does not deny the presence of any aspect of the invention which is described herein but is not claimed in this application, that is, the presence of an aspect generated or added by a divisional application and/or an amendment.

The present invention provides a transmission apparatus. This transmission apparatus (e.g., a server 12 shown in FIG. 4) includes a determining means (e.g., a congestion/non-congestion determining unit 105 in FIG. 6), generating means (e.g., an FEC (forward error correction) packet generator 84 in FIG. 6), and controlling means (e.g., an FEC transmission controller 86 in FIG. 6). The determining means determines whether or not a communications network is in a congestion state. The generating means generates error correction packets (e.g., an FEC packet group 182-1 shown in FIG. 8) that contains error correction data for correcting error of streaming data contained in transmission packets (e.g., an RTP (real-time transport protocol) packet group 181-1 shown in FIG. 8). When the determination results changes from a non-congestion state to a congestion state, the controlling means controls the error-correction-packet generation performed by the generating means so as to change the number of error correction packets.

Figure 8:
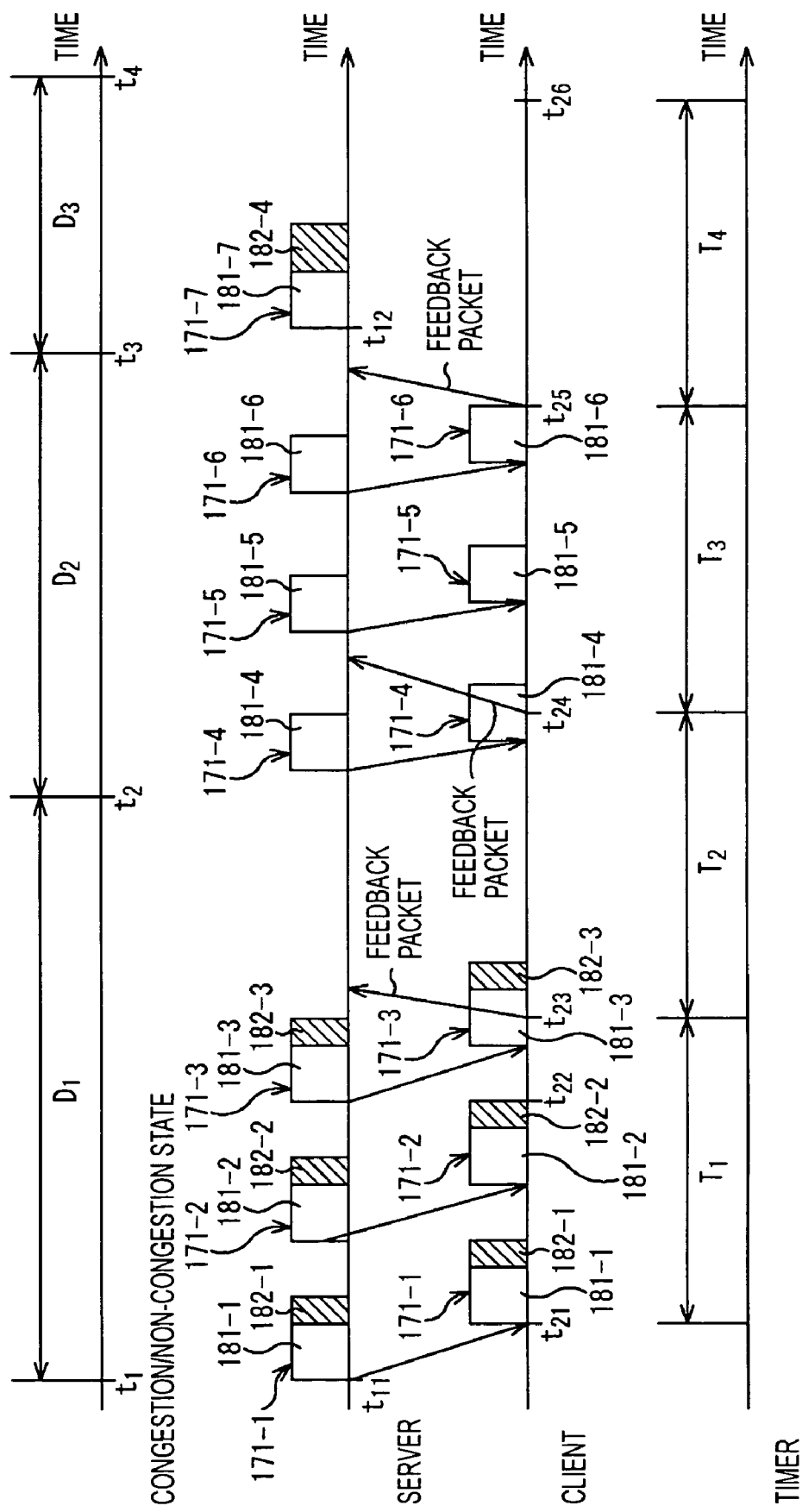
FIG. 8 is a time chart illustrating the transmission of FEC packets.

When it is determined that the communications network is in a congestion state, the controlling means (e.g., the FEC transmission controller 86 in FIG. 6), of the transmission apparatus can perform control so as to cause the generating means (e.g., the FEC-packet generator 84 in FIG. 6) to generate a predetermined number of error correction packets (e.g., the FEC packet group 182-1 in FIG. 8). When it is determined that the communications network in not in a congestion state, the controlling means can perform control so as to suppress the error-correction-packet generation performed by the generating means.

When the result of the determination changes from a non-congestion state to a congestion state, the controlling means (e.g., the FEC transmission controller 86 in FIG. 6) of the transmission apparatus performs control so as to cause the generating means (e.g., the FEC-packet generator 84 in FIG. 6) to change the number of error correction packets in accordance with the reception state of the transmission packets in the immediately previous congestion state.

In the transmission apparatus, at least one of the transmission packets defines one error correction unit (e.g., an FEC block 171-1 in FIG. 8) in a predetermined period of time. When the number of error correction packets in one or more of the error correction units is determined to be insufficient in the predetermined period of time in accordance with a state of reception of the one or more error correction units in the predetermined period of time, the controlling means (e.g., the FEC transmission controller 86 in FIG. 6) control the error-correction-packet generation performed by the generating means (e.g., the FEC-packet generator 84 in FIG. 6) so as to increase the number of error correction packets.

The determining means (e.g., the congestion/non-congestion determining unit 105 in FIG. 6) determines whether or not the communications network is in a congestion state, in accordance with short-range dependent delay time and long-range dependent delay time. The short-range dependent delay time depends on delay time required for transmitting the transmission packets to a receiving side in a period from first time to current time and the long-range dependent delay time depends on delay time required for transmitting the transmission packets to the receiving side in a period from the first time to second time that is earlier than the first time.

The present invention also provides a transmission method. This transmission method includes a determining step (e.g., processing in step S87 shown in FIG. 12), a generating step (e.g., processing in step S59 shown in FIG. 10), and a controlling step (e.g., processing in step S91 shown in FIG. 12).

In the determining step, a determination is made as to whether or not the communications network is in a congestion state. In the generating step, error correction packets containing error correction data for correcting error of streaming data contained in transmission packets are generated. In the controlling step, the generation of the error correction packets in the generating step is controlled such that the number of error correction packets is changed, when the result of the determination changes from a non-congestion state to a congestion state.

The present invention further provides a program. This program is executed by a computer and includes a determining step (e.g., the processing in step S87 shown in FIG. 12), a generating step (e.g., the processing in step S59 shown in FIG. 10), and a controlling step (e.g., the processing in step S91 shown in FIG. 12). In the determining step, a determination is made as to whether or not the communications network is in a congestion state. In the generating step, error correction packets containing error correction data for correcting error of streaming data contained in transmission packets are generated. In the controlling step, the generation of the error correction packets in the generating step is controlled such that the number of error correction packets is changed, when the result of the determination changes from a non-congestion state to a congestion state.

Figure 5:
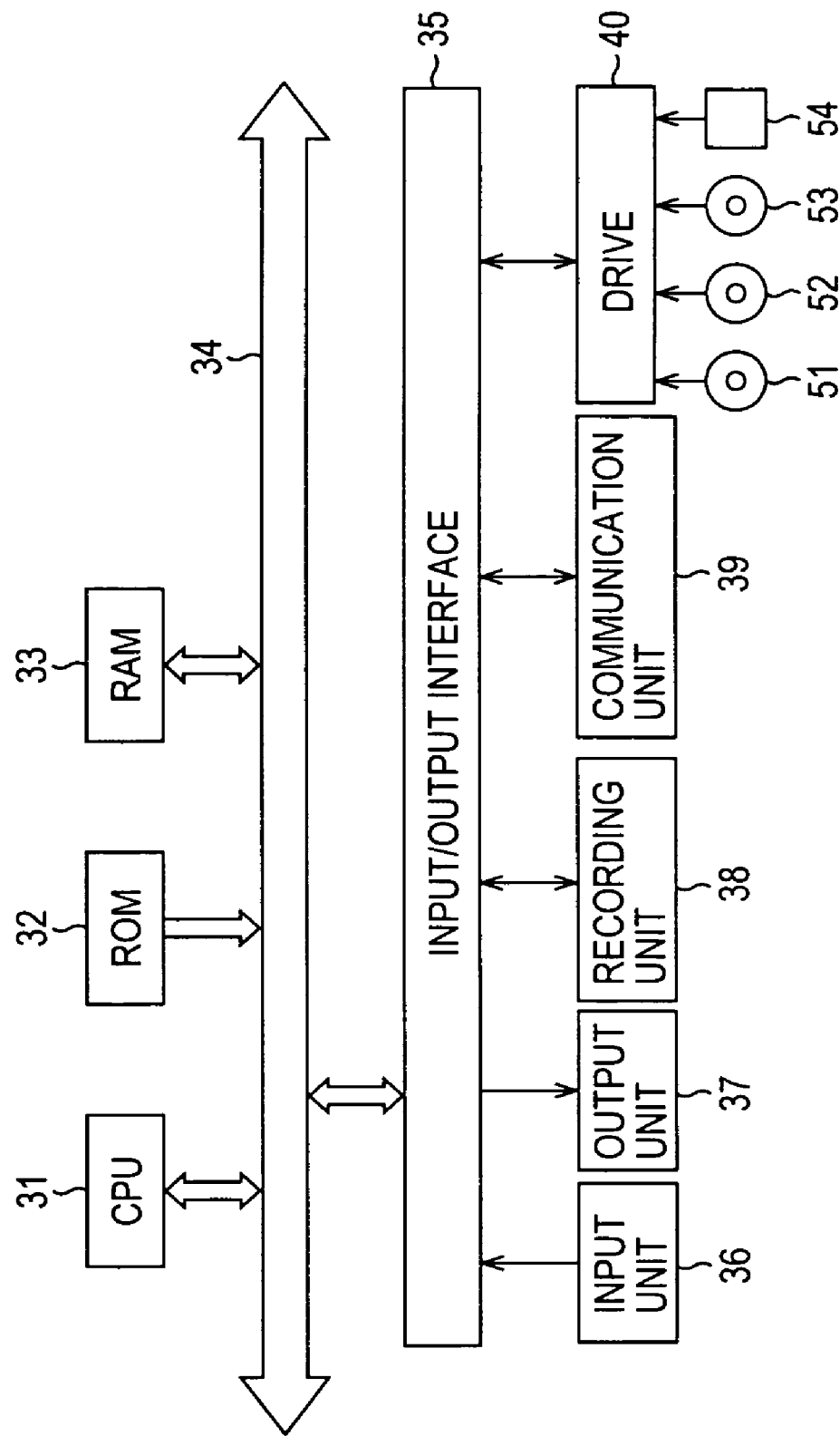
FIG. 5 is a bock diagram showing an exemplary configuration of a server.

This program can be recorded to a storage medium (e.g., a magnetic disk 51 shown in FIG. 5).

The present invention provides a reception apparatus. This reception apparatus (e.g., a client 14 shown in FIG. 4) includes reception controlling means (e.g., a receiver 151 shown in FIG. 7) and a determining unit (e.g., an FEC processor 135 in FIG. 7). The reception controlling means receives error correction packets (e.g., the FEC packet group 182-1 in FIG. 8) containing error correction data for correcting error of streaming data contained in transmission packets (e.g., the RTP packet group 181-1 in FIG. 8). The determining means determines whether or not the number of received error correction packets is appropriate for correcting error of the streaming data.

In the reception apparatus, the determining means (e.g., the FEC processor 135 shown in FIG. 7) may determine whether the number of received error correction packets is insufficient, adequate, or excessive for correcting error of the streaming data.

In the reception apparatus, the determining means (e.g., the FEC processor 135 in FIG. 7) may determine whether the number of received error correction packets (e.g., the FEC packet group 182-1 in FIG. 8) is insufficient, adequate, or excessive for correcting the error of the streaming data, for each error correction unit (e.g., the FEC block 171-1 in FIG. 8) defined by at least one of the transmission packets. The reception apparatus may further include setting means (e.g., a notification-FEC-state holding unit 137 in FIG. 7) for performing setting such that a notification to be transmitted to a receiving side indicates a shortage of the error correction packets, when the number of error corrections packets in one or more of the error correction units is determined to be insufficient in a predetermined period of time in accordance with the result of the determination for one or more of the error correction units in the predetermined period of time.

Figure 7:
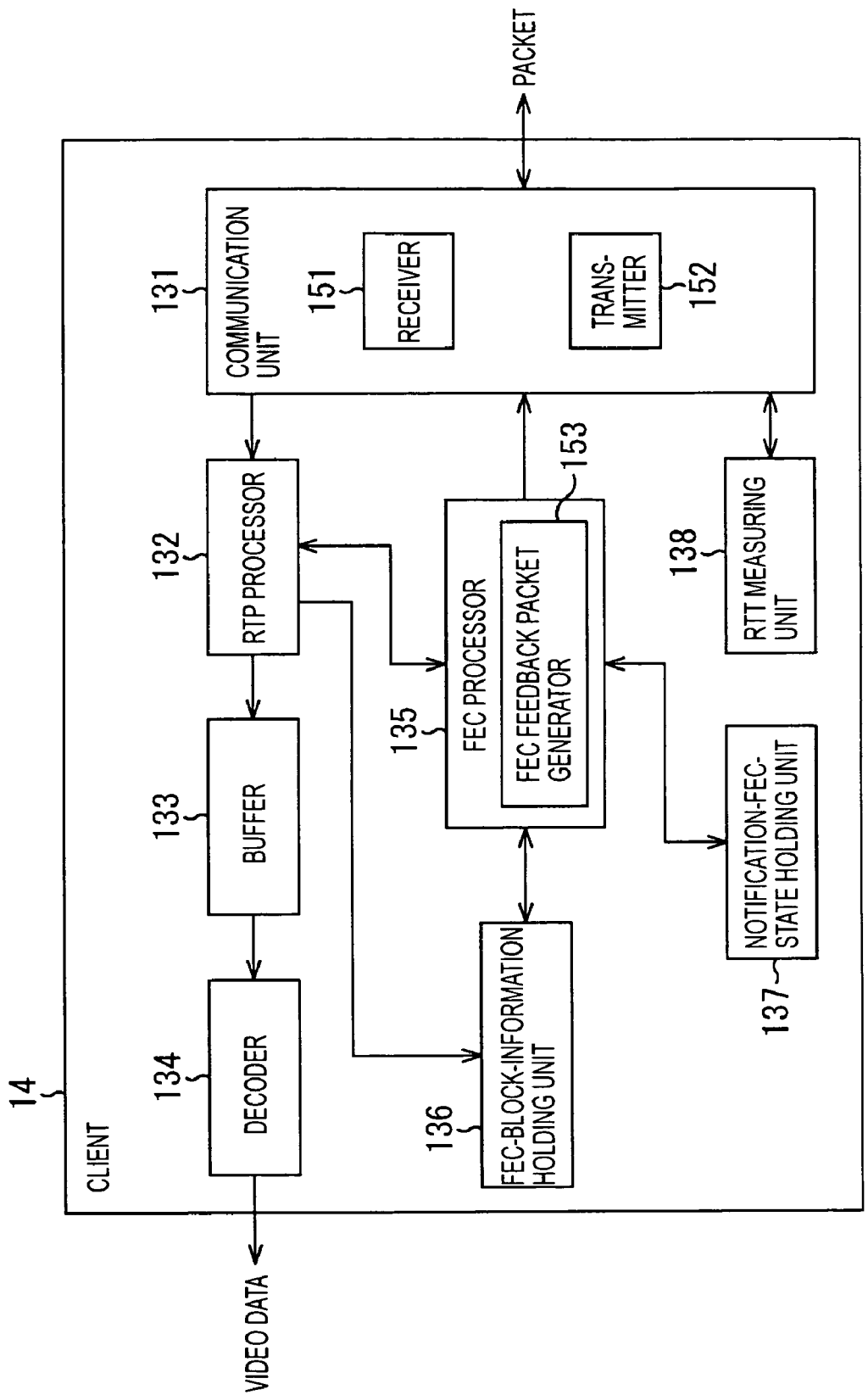
FIG. 7 is a bock diagram showing a functional configuration of a client.

The reception apparatus may further include a generating means (e.g., an FEC-feedback-packet generator 153 shown in FIG. 7) and a transmission controlling means (e.g., a transmitter 152 shown in FIG. 7). The generating means generates a feedback packet containing a notification based on the result of the determination and the transmission controlling means controls the transmission of the feedback packet generated by the generating means to a receiving end.

The present invention further provides a reception method. This reception method includes a reception controlling step (e.g., processing in step S172 shown in FIG. 18) and a determining step (e.g., processing in step S221 in FIG. 22). In the reception controlling step, error correction packets containing error correction data for correcting error of streaming data contained in transmission packets are received. In the determining step, a determination is made as to whether or not the number of error correction packets received in the reception controlling step is adequate for correcting the error of the streaming data.

The present invention further provides:a program. This program is executed by a computer and includes a reception controlling step (e.g., the processing in step S172 shown in FIG. 18) and a determining step (e.g., the processing in step S221 in FIG. 22). In the reception controlling step, error correction packets containing error correction data for correcting error of streaming data contained in transmission packets are received. In the determining step, a determination is made as to whether or not the number of error correction packets received in the reception controlling step is adequate for correcting the error of the streaming data.

This program can be recorded to a storage medium (e.g., the magnetic disk 51 shown in FIG. 5).

The present invention can be applied to communication systems that transmit streaming data in real time. Examples include Internet telephones, TV phones, remote TV conference systems, live-video streaming distribution systems, and communication systems for transmitting streaming data.

Figure 2:
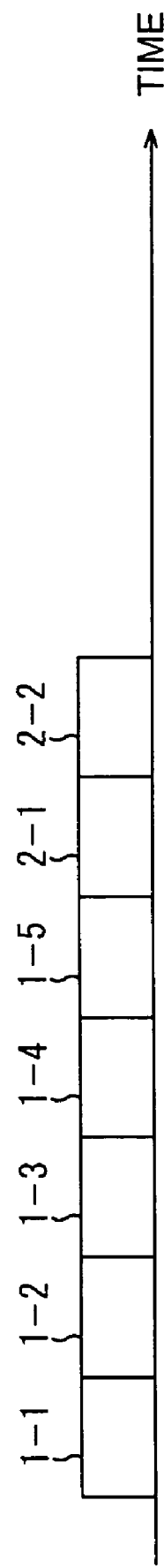
FIG. 2 illustrates a known transmission sequence of the FEC packets.
Figure 3:
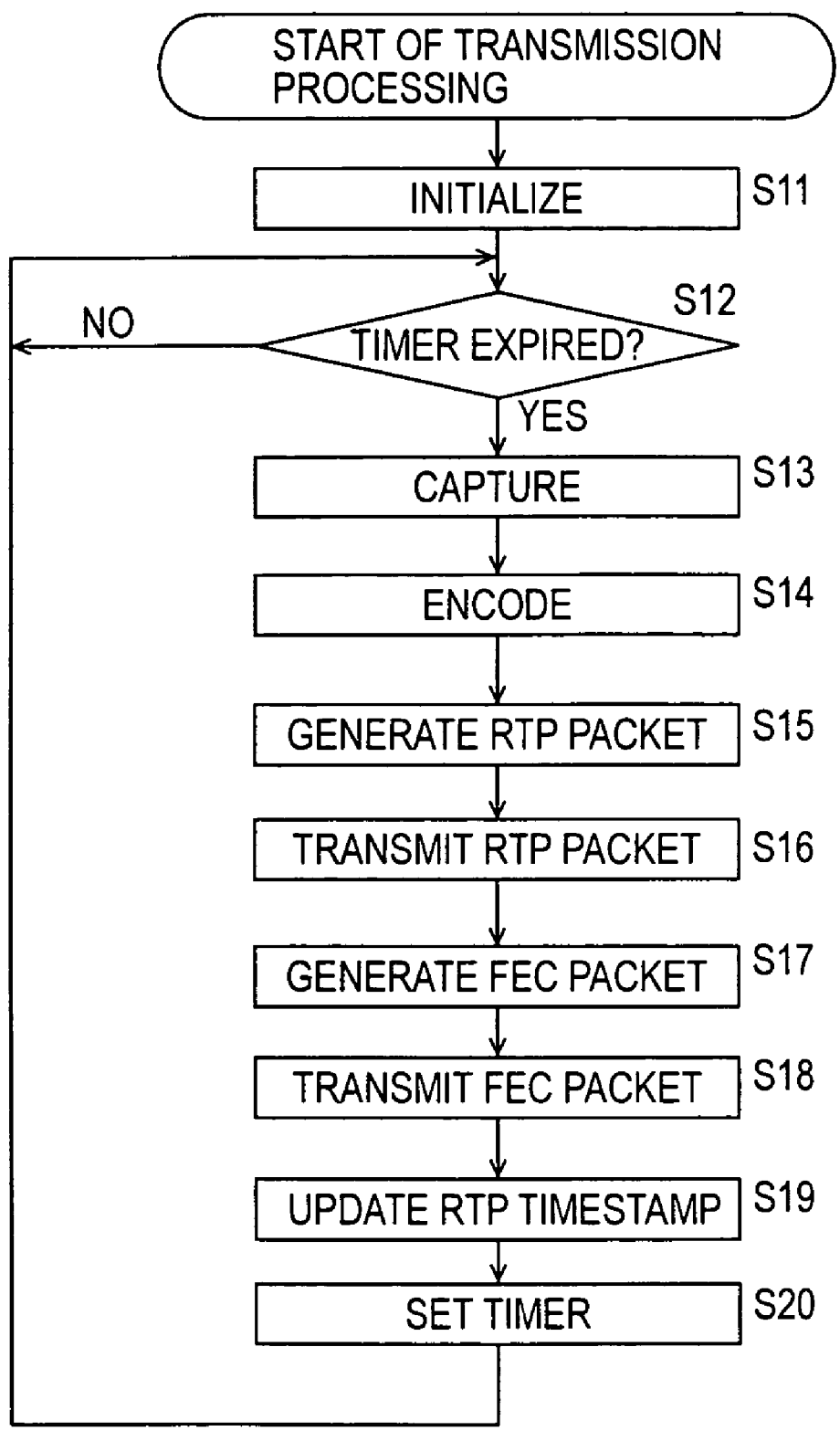
FIG. 3 is a flow chart illustrating known processing for transmitting packets with the FEC packets.
Figure 4:
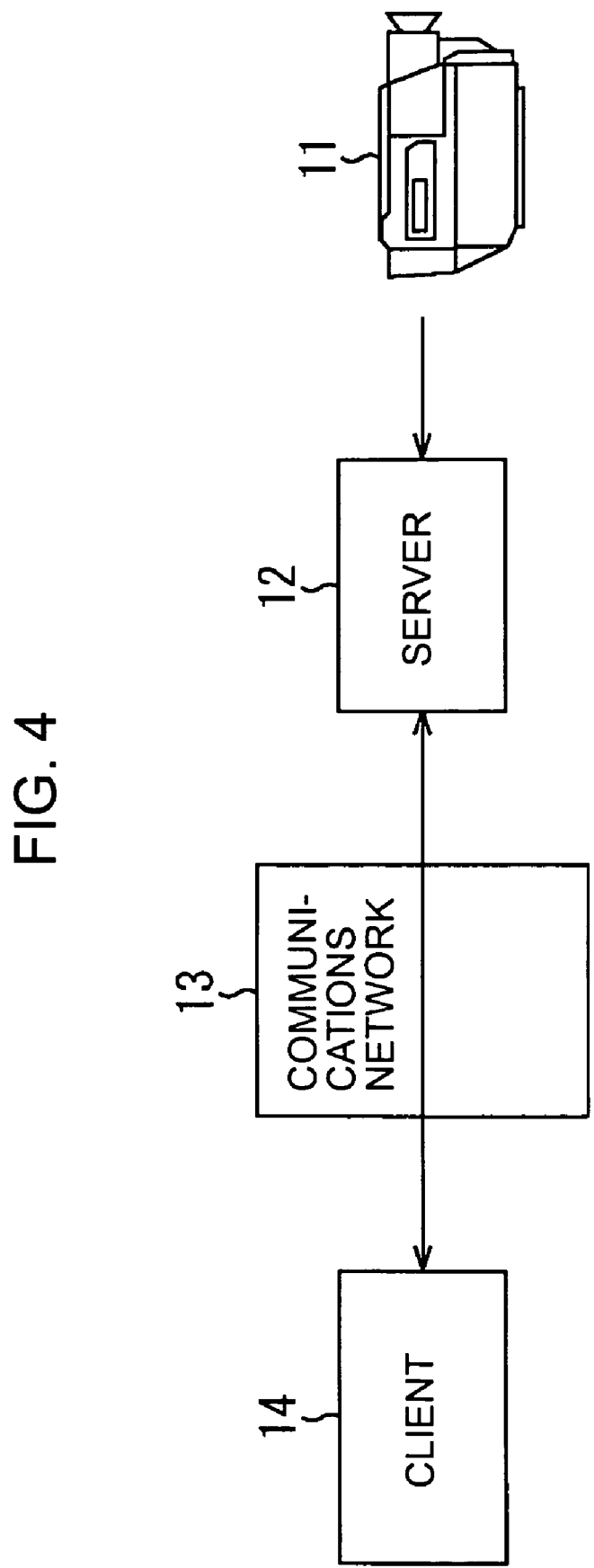
FIG. 4 shows a communication system according to one embodiment of the present invention.

FIG. 4 shows a communication system according to one embodiment of the present invention. A camera 11 captures an image and supplies video data, corresponding to the captured image, to a server 12. For example, the camera 11 captures a moving image and supplies video data, corresponding to the moving image, to the server 12.

The video data is one example of streaming data. The streaming data may be any data that requires sequential transmission or reception according to the lapse of time. Examples of the streaming data include audio data and real-time control data.

The server 12 encapsulates the video data, supplied from the camera 11, into packets and transmits the packets to the client 14 over a communications network 13. The server 12 also generates redundant data for correcting the packets containing video data, encapsulates the redundant data into packets, and transmits the resulting packets to the client 14 over the communications network 13.

The communications network 13 is a wired or wireless transmission path including, for example, the Internet or a communications line or network, and is used to transfer packets transmitted from the server 12 to the client 14.

The client 14 receives various packets transmitted from the server 12 over the communications network 13.

When the client 14 has failed to properly receive packets containing streaming data, the client 14 corrects error of packets containing video data it has failed to receive properly, in accordance with packets containing the redundant data.

The client 14 issues a notification indicating the reception state of the packets, transmitted from the server 12 over the communications network 13, to the server 12. The server 12 obtains the communication state of the communications network 13. For example, the server 12 obtains a state in which the communications network 13 is congested, in accordance with a round-trip time (RTT). The server 12 changes the number of packets containing the redundant data to be transmitted to the client 14, in accordance with the notification from the client 14 and transmission state of the communications network 13.

FIG. 5 is a bock diagram showing an exemplary configuration of the server 12. A CPU (central processing unit) 31 executes various types of processing in accordance with a program recorded in a ROM (read only memory) 32 or a recording unit 38. A RAM (random access memory) 33 stores data and/or a program executed by the CPU 31, as needed. The CPU 31, the ROM 32, and the RAM 33 are interconnected via a bus 34.

The CPU 31 is also connected to an input/output interface 35 via the bus 34. An input unit 36, which includes a keyboard, a mouse, and switches, and an output unit 37, which includes a display, speakers, and lamps, are connected to the input/output interface 35. The CPU 31 executes various types of processing in response to instructions input through the input unit 36.

The recording unit 38 is connected to the input/output interface 35 and includes, for example, a hard disk. The recording unit 38 records various types of data and/or a program executed by the CPU 31. A communication unit 39 communicates with an external apparatus, such as the client 14, over the communications network 13, such as the Internet or another network.

By obtaining a program via the communication unit 39, the server 12 may record the program to the recording unit 38.

Further, a drive 40 is connected to the input/output interface 35. A storage medium, such as a magnetic disk 51, an optical disk 52, a magneto-optical disk 53, or a semiconductor memory 54, is connected to the drive 40. The drive 40 drives the storage medium to obtain a program and/or data recorded therein. The obtained program and/or data is transferred to and recorded to the recording unit 38, as needed.

Since the client 14 has the same configuration as the server 12, the description thereof is not given below.

Figure 6:
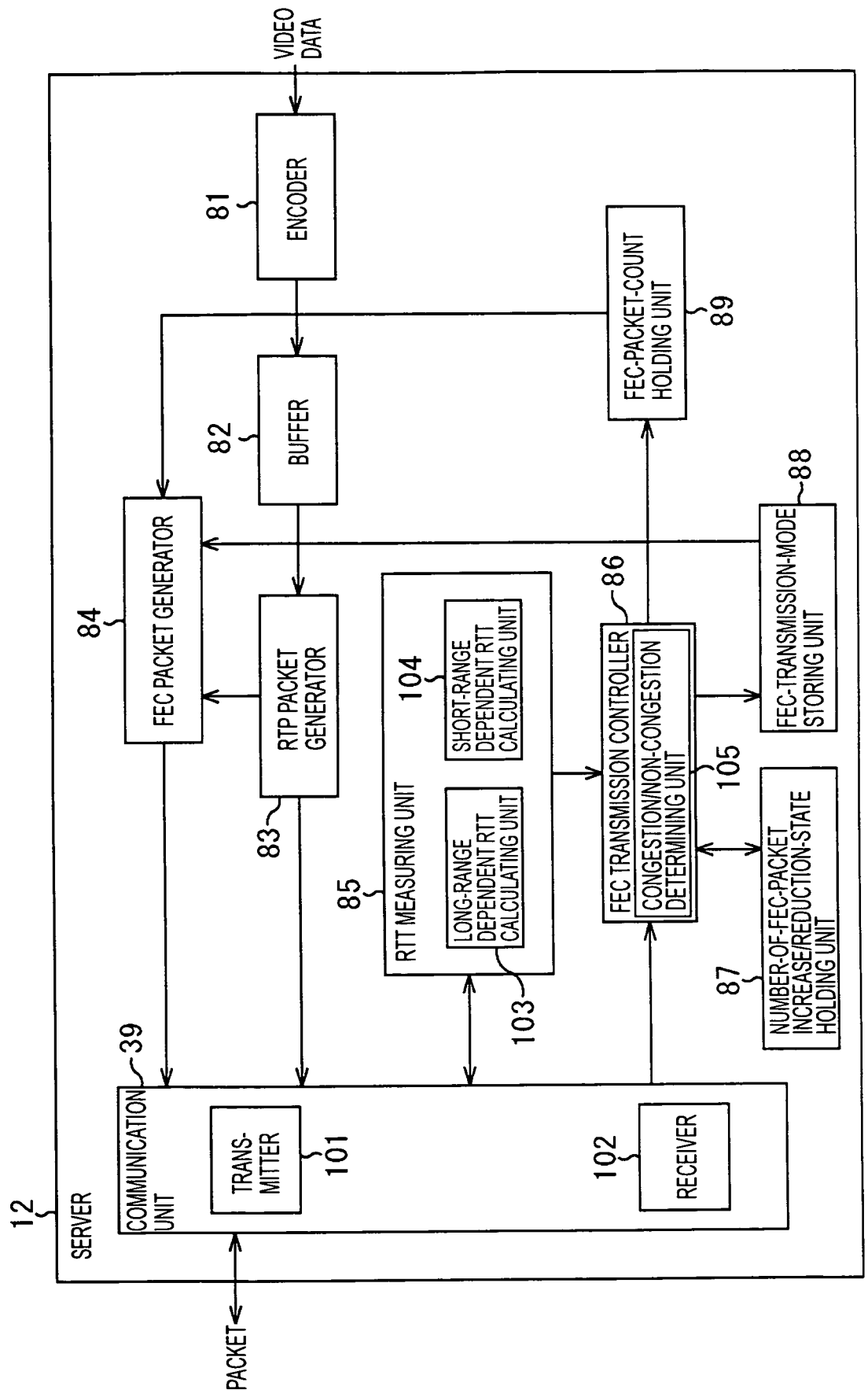
FIG. 6 is a bock diagram showing a functional configuration of the server.

FIG. 6 is a block diagram showing the configuration of the server 12 according to one embodiment of the present invention.

The server 12 is configured to include the communication unit 39, an encoder 81, a buffer 82, an RTP (real-time transport protocol) packet generator 83, an FEC (forward error correction) packet generator 84, an RTT (round-trip time) measuring unit 85, an FEC transmission controller 86, a number-of-FEC-packet increase/reduction-state holding unit 87, an FEC-transmission-mode storing unit 88, and an FEC-packet-count holding unit 89.

The encoder 81 encodes video data (which is one example of streaming data) supplied from the camera 11 and supplies the encoded video data to the buffer 82.

The buffer 82 temporarily stores the video data supplied from the encoder 81.

The RTP-packet generator 83 obtains the encoded video data from the buffer 82. The RTP-packet generator 83 then generates RTP packets by encapsulating the obtained video data into RTP-format packets and supplies the generated RTP packets to the communication unit 39.

The RTP packets are based on the scheme of an RTP (Real-time Transport Protocol), which is specified by IETF RFC (Internet Engineering Task Force Request For Comments) 1889.

The RTP-packet generator 83 also supplies RTP-packet data, contained in the generated RTP packets, to the FEC-packet generator 84.

The FEC-packet generator 84 refers to an FEC-transmission-mode flag stored in the FEC-transmission-mode storing unit 88. When the mode flag indicates an FEC transmission mode, the FEC-packet generator 84 uses data in the RTP packets supplied from the RTP-packet generator 83 to generate a number of packets which is indicated by an FEC packet count (i.e., the number of FEC packets) supplied from the FEC-packet-count holding unit 89, according to a predetermined error correction scheme. The FEC-packet generator 84 supplies the generated FEC packets to the communication unit 39.

When the mode flag does not indicate the FEC transmission mode, the FEC-packet generator 84 does not generate FEC packets.

The communication unit 39 has a transmitter 101 for transmitting various packets and a receiver 102 for receiving various packets, thereby transmitting/receiving the packets over the communications network 13.

When the communication unit 39 receives the RTP packets supplied from the RTP-packet generator 83 and the FEC packets supplied from the FEC-packet generator 84, the transmitter 101 of the communication unit 39 transmits those packets to the client 14 over the communications network 13.

More specifically, the transmitter 101 of the communication unit 39 temporarily holds the RTP packets supplied from the RTP-packet generator 83 and the FEC packets supplied from the FEC-packet generator 84. Thereafter, the transmitter 101 transmits, as one FEC block, the RTP packets and the FEC packets which contain the same FEC block ID to the client 14 over the communications network 13, according to a predetermined scheme, such as a burst transfer scheme. Details of the FEC block ID for identification of an FEC block will be described later.

The RTT measuring unit 85 supplies an RTT measurement packet to the communication unit 39. The transmitter 101 of the communication unit 39 then transmits the RTT measurement packet to the client 14 over the communications network 13.

The receiver 102 of the communication unit 39 receives an RTT measurement packet transmitted from the client 14 over the communications network 13 and then supplies the RTT measurement packet to the RTT measuring unit 85. The receiver 102 of the communication unit 39 also receives an FEC feedback packet transmitted from the client 14 over the communications network 13 and then supplies the FEC feedback packet to the FEC transmission controller 86.

As described above, the RTT measuring unit 85 generates an RTT measurement packet and supplies the generated RTT measurement packet to the communication units 39. The RTT measuring unit 85 also calculates delay time (i.e., RTT) in accordance with the RTT measurement packet received by and supplied from the communication unit 39.

The RTT measuring unit 85 has a long-range dependent RTT calculating unit 103 for calculating long-range dependent RTT and a short-range dependent RTT calculating unit 104 for calculating short-range dependent RTT. The long-range dependent RTT calculating unit 103 of the RTT measuring unit 85 calculates long-range dependent RTT, based on the delay time calculated by the RTT measuring unit 85. The short-range dependent RTT calculating unit 104 of the RTT measuring unit 85 calculates short-range dependent RTT, based on the delay time calculated by the RTT measuring unit 85. Details of the long-range dependent RTT and the short-range dependent RTT will be described later.

The RTT measuring unit 85 further supplies the long-range dependent RTT, calculated by the long-range dependent RTT calculating unit 103, and the short-range dependent RTT, calculated by the short-range dependent RTT calculating unit 104, to the FEC transmission controller 86.

The FEC transmission controller 86 controls the FEC-packet generation performed by the FEC-packet generator 84. The FEC transmission controller 86 has the congestion/non-congestion determining unit 105 for determining whether or not the communications network 13 is in a congestion state.

More specifically, based on the long-range dependent RTT and the short-range dependent RTT supplied from the RTT measuring unit 85, the congestion/non-congestion determining unit 105 of the FEC transmission controller 86 determines whether or not the communications network 13 is in a congestion state, and then stores the result of the determination. When the determination result indicates that the communications network 13 is in a congestion state, the FEC transmission controller 86 sets the FEC-transmission-mode flag in the FEC-transmission-mode storing unit 88 (e.g., sets "1"). When the determination result indicates that the communications network 13 is not in a congestion state, i.e., is in a non-congestion state, the FEC transmission controller 86 resets the FEC-transmission-mode flag in the FEC-transmission-mode storing unit 88 (e.g., sets "0").

In accordance with the FEC feedback packets received by and supplied from the communication unit 39, the FEC transmission controller 86 updates a number-of-FEC-packet increase/reduction state held in the number-of-FEC-packet increase/reduction-state holding unit 87. The number-of-FEC-packet increase/reduction state indicates whether the number of FEC packets is to be increased, reduced, or maintained. Details of processing for changing the number-of-FEC-packet increase/reduction state will be described later.

The FEC transmission controller 86 further reads the number-of-FEC-packet increase/reduction state held in the number-of-FEC-packet increase/reduction-state holding unit 87 to update an FEC packet count held by the FEC-packet-count holding unit 89. Details of processing for changing the number of FEC packets will be described later.

The number-of-FEC-packet increase/reduction-state holding unit 87 holds (stores) the number-of-FEC-packet increase/reduction state supplied from the FEC transmission controller 86.

The FEC-transmission-mode storing unit-88 stores the FEC-transmission-mode flag that indicates whether or not the operation is in the FEC transmission mode. When the FEC-transmission-mode flag is set (e.g., "1" is indicated), this represents that the operation is in the FEC transmission mode. When the FEC-transmission-mode flag is reset (e.g., "0" is indicated), this represents that the operation is not in the FEC transmission mode. When the operation is in the FEC transmission mode, the FEC-packet generator 84 generates FEC packets. When the operation is not in the FEC transmission mode, the FEC-packet generator 84 does not generate FEC packets.

When the communications network 13 is in a congestion state, the FEC-transmission-mode flag stored in the FEC-transmission-mode storing unit 88 is set by the FEC transmission controller 86. When the communications network 13 is a non-congestion state, the FEC-transmission-mode flag stored in the FEC-transmission-mode storing unit 88 is reset by the FEC transmission controller 86.

That is, when the communications network 13 is in a congestion state, the operation is in the FEC transmission mode, so that FEC packets are generated and transmitted. On the other hand, when the communications network 13 is not in a congestion state, the operation is not in the FEC transmission mode, so that no FEC packets are generated and transmitted.

The FEC-packet-count holding unit 89 holds the FEC packet count supplied from the FEC transmission controller 86. The FEC-packet-count holding unit 89 also supplies the FEC packet count, supplied from the FEC transmission controller 86, to the FEC-packet generator 84.

The arrangement may also be such that the FEC-packet generator 84 includes the number-of-FEC-packet increase/reduction-state holding unit 87, the FEC-transmission-mode storing unit 88, and the FEC-packet-count holding unit 89.

FIG. 7 is a block diagram showing the configuration of the client 14 according to an embodiment of the present invention.

The client 14 is configured to include a communication unit 131, an RTP processor 132, a buffer 133, a decoder 134, an FEC processor 135, an FEC-block-information holding unit 136, a notification-FEC-state holding unit 137, and an RTT measuring unit 138.

The communication unit 131 corresponds to the communication unit 39 of the server 12 and has a receiver 151 for controlling the reception of packets and a transmitter 152 for controlling the transmission of packets. The receiver 151 of the communication unit 131 receives various packets transmitted over the communications network 13 and supplies the received packets to the RTP processor 132 or the RTT measuring unit 138. The transmitter 152 of the communication unit 131 transmits various packets over the communications network 13.

The RTP processor 132 inspects RTP packets and FEC packets received by and supplied from the communication unit 131. Upon receiving a normal FEC packet, the RTP processor 132 supplies the received FEC packet to the FEC processor 135 and also supplies FEC header information to the FEC-block-information holding unit 136. On the other hand, upon receiving an abnormal FEC packet, the RTP processor 132 dicards the received FEC packet.

Also, upon receiving a normal RTP packet, the RTP processor 132 temporarily holds the RTP packets and supplies RTP header information to the FEC-block-information holding unit 136. When the RTP processor 132 receives an abnormal RTP packet and receives an FEC packet containing the same FEC block ID as an FEC packet contained in the received packet, the RTP processor 132 supplies a signal requesting the abnormal-RTP packet recovery to the FEC processor 135.

When the RTP processor 132 receives an abnormal RTP packet and does not receive an FEC packet containing the same FEC block ID as an FEC block ID contained in the received RTP packet, the RTP processor 132 discards the RTP packet.

In the case in which the RTP processor 132 does not supply the signal requesting the RTP packet recovery to the FEC processor 135, the RTP processor 132 supply the temporarily held RTP packet(s) to the buffer 133, upon completion of the packet reception.

In the case in which the RTP processor 132 supplies the signal requesting the RTP packet recovery to the FEC processor 135, the recovered RTP packet(s) are supplied from the FEC processor 135 to the RTP processor 132 after the packet reception is completed. Then, the RTP processor 132 supplies the held RTP packets and the recovered RTP packet(s) to the buffer 133.

Further, when the RTP packets or the FEC packet(s) are properly received, the RTP processor 132 increments the number of received packets, which number is stored in an FEC-block-information table held in the FEC-block-information holding unit 136. When an FEC block ID contained in the received RTP packets or FEC packet(s) changes, the FEC-block-information holding unit 136 updates the FEC block information held in the FEC-block-information holding unit 136. Details of the FEC-block-information table and details of processing for updating the FEC block information will be described later.

The buffer 133 temporarily stores the RTP packets supplied from RTP processor 132.

The decoder 134 sequentially obtains the RTP packets stored in the buffer 133 and extracts video data from the obtained RTP packets. The decoder 134 decodes the extracted video data by using a decoding scheme corresponding to the encoder 81 and outputs the decoded video.

The FEC processor 135 has the FEC feedback generator 153 for generating an FEC feedback packet.

The FEC processor 135 temporarily holds the FEC packet(s) supplied from RTP processor 132. When the signal requesting the abnormal-RTP-packet recovery is supplied from the RTP processor 132, the FEC processor 135 recovers the RTP packet(s) based on the FEC packet(s) and supplies the recovered RTP packet(s) to the RTP processor 132.

More specifically, for example, the FEC processor 135 obtains RTP packets that are properly received and temporarily stored by the RTP processor 132 and that are required for recovery processing, and recovers an RTP packet or RTP packets that are not properly received, in accordance with the obtained RTP packets and the FEC packet(s).

When the signal for requesting the abnormal-RTP-packet recovery is not supplied from the RTP processor 132, the FEC processor 135 discards the held FEC packet(s) upon completion of the packet reception.

The arrangement may also be such that the RTP processor 132 recovers RTP packets.

When an FEC block ID recorded in the FEC-block-information table held by the FEC-block-information holding unit 136 changes, the FEC processor 135 updates the FEC block state indicating whether or not the number of FEC packets which is held (recorded) by the FEC-block-information holding unit 136 is adequate, in accordance with the FEC block information. The FEC processor 135 reads the FEC block information held in the FEC-block-information holding unit 136 to update a notification FEC state held in the notification-FEC-state holding unit 137. Processing for updating the FEC block state and processing for updating the notification FEC state will be described later.

The FEC-feedback-packet generator 153 of the FEC processor 135 generates an FEC feedback packet in accordance with the notification FEC state held in the notification-FEC-state holding unit 137, and supplies the generated FEC feedback packet to the communication unit 131. Details of the FEC feedback packet will be described later.

The FEC-block-information holding unit 136 holds (records) the FEC block information that is updated by the RTP processor 132 and the FEC processor 135.

The notification-FEC-state holding unit 137 holds the notification FEC state that is updated by the FEC processor 135.

The RTT measuring unit 138 obtains the RTT measurement packet received by and supplied from the communication unit 131. The RTT measuring unit 138 generates an RTT measurement packet containing the same data portion as the data portion of the obtained RTT measurement packet and supplies the generated RTT measurement packet to the communication unit 131.

The functions of the server 12 shown in FIG. 6 and/or the functions of the client 14 shown in FIG. 7 may be implemented by hardware or software (program).

Processing in which the server 12 transmits an FEC block is described next with reference to a time chart shown in FIG. 8.

The horizontal direction in FIG. 8 indicates time. In FIG. 8, a period D1 from time t1 to time t2 and a period D3 from time t3 to time t4 indicate periods in which the communications network 13 is in a congestion state. A period D2 from time t2 to time t3 indicates a period in which the communications network 13 is in a non-congestion state.

When the communications network 13 is in a congestion state, the server 12 transmits an FEC block containing an FEC packet group. When the communications network 13 is in a non-congestion state, the server 12 transmits an FEC block that does not contain an FEC packet group. Further, the server 12 changes the number of FEC packets contained in the FEC packet group, in accordance with an FEC feedback packet received from the client 14. That is, at time t11, since the communications network 13 is in a congestion state, the serve 12 transmits, as one FEC block, RTP packets and FEC packets which contain the same FEC block ID to the client 14.

More specifically, in FIG. 8, for example, the server 12 encapsulates streaming data that is video data for playback of one frame into four RTP packets (i.e., an RTP packet group 181-1) in an FEC block 171-1. The server 12 also encapsulates redundant data for the streaming data for playback of the frame into two FEC packets (i.e., an FEC packet group 182-1) in the FEC block 171-1. The server 12 then transmits the FEC block 171-1, which is defined by the RTP packet group 181-1 and the FEC packet group 182-1 which contain the streaming data for playback of the frame, to the client 14 over the communications network 13.

At time t21, the client 14 receives the FEC block 171-1 transmitted from the server 12 over the communications network 13.

Similarly, the server 12 encapsulates streaming data that is video data for playback of a next frame into four RTP packets (i.e., an RTP packet group 181-2) in an FEC block 171-2. The server 12 also encapsulates redundant data for the streaming data for playback of the frame into two FEC packets (i.e., an FEC packet group 182-2) in the FEC block 171-2. The server 12 then transmits the FEC block 171-2, which is defined by the RTP packet group 181-2 and the FEC packet group 182-2 which contain the streaming data for playback of the frame, to the client 14 over the communications network 13.

Further, the server 12 encapsulates streaming data that is video data for playback of a next frame into four RTP packets (i.e., an RTP packet group 181-3) in an FEC block 171-3. The server 12 also encapsulates redundant data for the streaming data for playback of the frame into two FEC packets (i.e., an FEC packet group 182-3) in the FEC block 171-3. The server 12 then transmits the FEC block 171-3, which is defined by the RTP packet group 181-3 and the FEC packet group 182-3 which contain the streaming data for playback of the frame, to the client 14 over the communications network 13.

Since the state of the communications network 13 changes from a congestion state to a non-congestion state at time t2, the server 12 transmits an FEC block that does not contain an FEC packet to the client 14 over the communications network 13 after time t2.

The server 12 encapsulates streaming data that is video data for playback of one frame subsequent to the frame of the FEC block 171-3 into four RTP packets (i.e., an RTP block 181-4) in an FEC block 171-4. The server 12 then transmits the FEC block 171-4, which is defined by the RTP packet group 181-4, to the client 14 over the communications network 13. The server 12 further encapsulates streaming data that is video data for playback of a next frame into four RTP packets (i.e., an RTP block 181-5).in an FEC block 171-5. The server 12 then transmits the FEC block 171-5, which is defined by the RTP packet group 181-5, to the client 14 over the communications network 13. The server 12 further encapsulates streaming data that is video data for playback of a subsequent frame into four RTP packets (i.e., an RTP block 181-6) in an FEC block 171-6. The server 12 then transmits the FEC block 171-6, which is defined by the RTP packet group 181-6, to the client 14 over the communications network 13.

Since the state of the communications network 13 changes from a non-congestion state to a congestion state at time t3, the server 12 transmits redundant data together with streaming data to the client 14 over the communications network 13 after time t3.

Specifically, the server 12 encapsulates video data for playback of one frame subsequent to the frame of the FEC block 171-6 into four RTP packets (i.e., an RTP packet group 181-7) in an FEC block 171-7. The server 12 also encapsulates redundant data for the streaming data for playback of the frame into two FEC packets (i.e., an FEC packet group 182-4) in the FEC block 171-7. The server 12 then transmits the FEC block 171-7, which is defined by the RTP packet group 181-7 and the FEC packet group 182-4 which contain the streaming data for playback of the frame, to the client 14 over the communications network 13.

A period T1 from time t21 to time t23, a period T2 from time t23 to time t24, a period T3 from time t24 to time t25, and a period T4 from time t25 to time t26 are defined by a timer and are each a period of time in which the client 14 performs processing for transmitting an FEC feedback packet. Thus, the client 14 generates an FEC feedback packet at each of time t23, time t24, time t25, and time t26 at which the timer expires, and transmits the generated FEC feedback packet to the server 12 over the communications network 13.

Hereinafter, the FEC blocks 171-1 to 171-7 will simply be referred to as an "FEC block 171", unless they need to be otherwise distinguished from each other. Similarly, hereinafter, the RTP packet groups 181-1 to 181-7 will simply be referred to as an "RTP packet group 181", unless they need to be otherwise distinguished from each other, and the FEC packet groups 182-1 to 182-4 will simply be referred to as an "FEC packet group 182", unless they need to be otherwise distinguished from each other.

Upon receiving the FEC block 171 transmitted from the server 12 over the communications network 13, the client 14 records FEC block information. The FEC block information is recorded to, for example, an FEC-block-information table shown in FIG. 9.

Upon receiving the FEC block 171, the client 14 records information contained in the FEC block 171 to the FEC-block-information table. The information recorded includes the FEC block ID that is an identification number unique to the FEC block 171, the number of original data packets which indicates the number of RTP packets contained in the FEC block 171, the total number of packets which is the sum total of the number of RTP packets and the number of FEC packets contained in the FEC block 171, the number of received packets which indicates the number of properly received packets, and an FEC block state indicating whether the number of FEC received packets is insufficient, adequate, or excessive for recovery of lost packets.

FIG. 9 shows an example of the FEC-block-information table.

In this example shown in FIG. 9, for an FEC block 171 with FEC block ID 1, the total number of packets is six, whereas the number of received packets is four. Thus, two packets are lost. Also, while the total number of packets in the FEC block 171 with FEC block ID 1 is six, the number of original data packets therefor is four. This indicates that two FEC packets are contained in the FEC block 171 with FEC block ID 1.

Since one RTP packet can be recovered per one FEC packet, the use of two FEC packets contained in the FEC block 171 with FEC block ID 1 can recover two lost packets. Thus, the number of FEC packets contained in the FEC block 171 with FEC block ID 1 is neither excessive nor insufficient, so that the FEC block state is set as an adequate state.

Similarly, with regard to an FEC block-171 with FEC block ID 2, two FEC packets are contained in this FEC block 171 and three packets are lost. Thus, out of the three lost packets, one lost packet cannot be recovered. Thus, because of one FEC packet short, the FEC block state is set as a shortage state.

Similarly, with regard to an FEC block 171 with FEC block ID 3, two FEC packets are contained in this FEC block 171 and no packet is lost. Thus, the two FEC packets are not used and are discarded. Thus, since two FEC packets are excessive, the FEC block state is set as an excess state.

Referring back to the time chart shown in FIG. 8, for example, at time t22, the client 14 detects the packet loss of three packets from the FEC block 171-2. The client 14 then sets the FEC block state of the FEC block 171-2 as a shortage state. Since the period T1 ends (i.e., the timer expires) at time t23, the client 14 generates, for example, an FEC feedback packet indicating the FEC packet shortage, in accordance with the FEC block state of each FEC block 171 received from time t21 to time t23 and transmits the generated FEC feedback packet to the server 12 over the communications network 13. Details of the FEC feedback packet will be described later.

At each of time t24 at which the period T2 ends and time t25 at which the period T3 ends, the client 14 also transmits an FEC feedback packet to the server 12 over the communications network 13.

Since the state of the communications network 13 changes from a non-congestion state to a congestion state at time t3, the server 12 changes the number of FEC packets contained in the FEC block 171, in accordance with feedback packets received from the client 14 over the communications network 13 from time t1 to time t3. For example, at time t12, the server 12 transmits the FEC block 171-7 containing three FEC packets to the client 14 over the communications network 13.

As described above, in accordance with the congestion state of the communications network 13 and an FEC feedback packet transmitted from the client 14, the server 12 changes the number of FEC packets contained in the FEC block 171 and transmits the FEC block 171.

Figure 10:
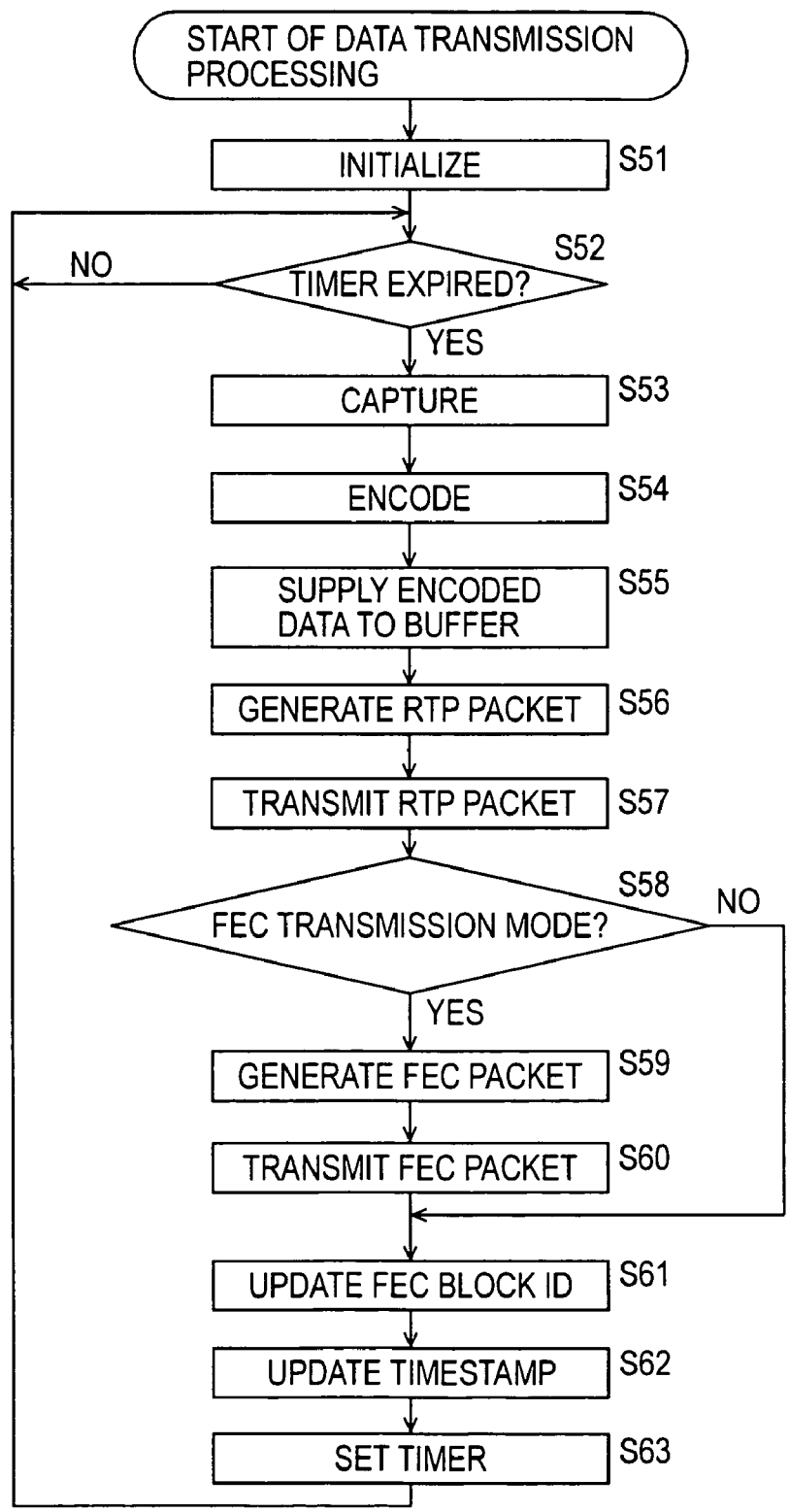
FIG. 10 is a flow chart illustrating data transmission processing.

Processing in which the server 12 that executes a server program transmits data is described next with reference to a flow chart shown in FIG. 10.

First, in step S51, the server 12 initializes data needed for transmission processing. In step S51, for example, the encoder 81 sets the value of an internal timer to zero millisecond and the RTP-packet generator 83 initializes a timestamp and a sequence number and sets the value of the FEC block ID to "1".

In step S52, based on the value of the internal timer, the encoder 81 determines whether or not the timer has expired. When the timer has not expired, the process returns to step S52, in which the determination processing is repeated until when it is determined that the timer expires.

When it is determined in step S52 that the timer has expired, the process proceeds to step S53.

For example, when the number of frames in video data is 30 per second, in step S52, the encoder 81 determinations whether or not the timer has expired by comparing the timer value with a predetermined value, for example, 33 milliseconds, as the timer value increases according to the lapse of time.

In step S51, for example, the encoder 81 sets the timer value to 33 milliseconds, and determines whether the timer has expired by comparing the timer value with zero millisecond, as the timer value decreases according to the lapse of time.

In this case, the value "zero millisecond" or "33 milliseconds" compared with the timer value is an example for 30 frames per second and is not intended to limit the present invention.

The same is true for timer-related processing described below.

In step S53, the encoder 81 captures video data supplied from the camera 11 such that the amount of video data corresponds to one frame. In step S53, for example, the encoder 81 sequentially obtains video data supplied from the camera 11 and captures video data for one frame out of the obtained video data.

In step S54, the encoder 81 encodes the captured video data. In step S54, the encoder 81 may encode the captured video data based on an MPEG (Moving Picture Experts Group) 1, 2, 4, 7, or 21 scheme, JPEG (Joint Photographic Experts Group) scheme, JPEG2000 scheme, or motion JPEG scheme.

In step S55, the encoder 81 supplies the encoded video data to the buffer 82 and the buffer 82 stores the encoded video data.

In step S56, the RTP-packet generator 83 obtains the decoded video data from the buffer 82 and generates RTP packets containing the obtained video data.

Figure 11:
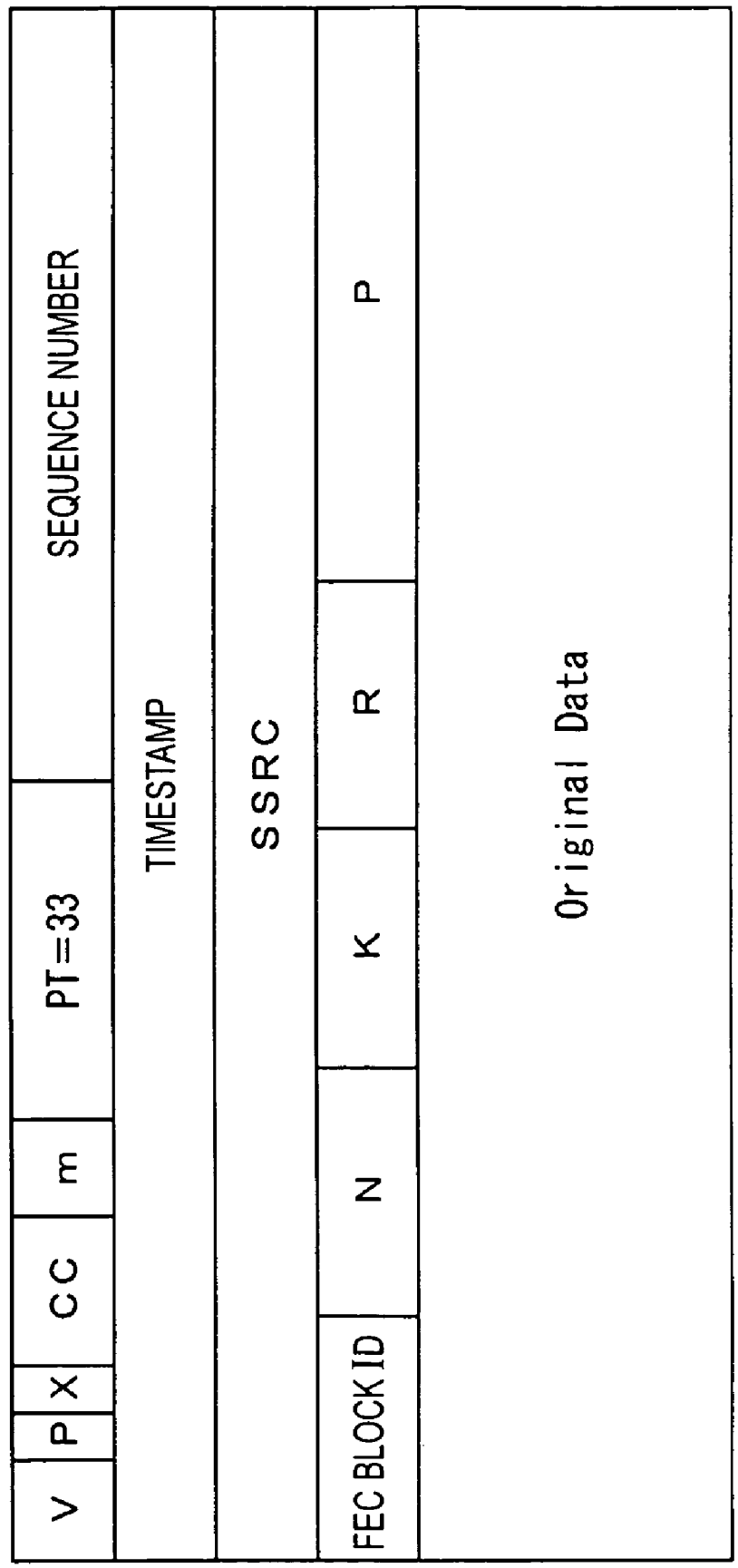
FIG. 11 illustrates an RTP packet.

FIG. 11 illustrates an RTP packet. The start of the RTP packet has two-bit version information, which is denoted by "V" in FIG. 11. The version information represents the version of the RTP packet.

The version information is followed by a one-bit padding denoted by "P" in FIG. 11. Subsequent to the padding, one-bit extension information is provided in the RTP packet. The extension information is denoted by "X" in FIG. 11. The extension information is set to a predetermined value when an extension header is included in the RTP packet.

Subsequent to the extension information, a CSRC (contribution source) count is provided in the RTP packet. The CSRC count is denoted by "CC" in FIG. 11. The CSRC count indicates the number of CSRC identifiers.

The CSRC count is followed by one-bit marker information, which is defined by a profile. The marker information is denoted by "m" in FIG. 11.

The marker information is followed by a seven-bit payload type, which is information for defining the format of the RTP packet. The payload type is denoted by "PT" in FIG. 11. The RTP packet has a payload type of 33.

A sequence number is 16-bit information following the payload type. The sequence number indicates the sequence of playback of RTP packets and increments by one for each transmission.

The sequence number is followed by a 32-bit timestamp, which represents the sampling time of the first octet of streaming data contained in the RTP packet. The receiving side uses the timestamp to control processing time during decompression of the RTP packet, thereby allowing for playback control of real-time video or audio data. A common timestamp is added to multiple RTP packets belonging to the same video frame.

A SSRC (synchronization source) identifier is 32-bit information provided subsequent to the timestamp and represents the source of streaming data contained in the RTP packet.

In the RTP packet, the SSRC identifier is followed by an FEC block ID. The FEC block ID is a number for identifying the FEC block 171, which is a group of RTP packets and FEC packets, to be transmitted from the server 12 to the client 14 over the communications network 13. For example, in FIG. 8, RTP packets belonging to the RTP packet group 181 is given the same FEC block ID. The FEC packets belonging to the FEC packet group 182 in one FEC block 171 contain the same FEC block ID as the FEC block ID of the RTP packets belonging to the RTP packet group 181 in the FEC block 171.

Subsequent to the FEC block ID, the total number of packets is provided in the RTP packet. The total number of packets is denoted by "N" in FIG. 11 and represents the sum total of the number of RTP packets and the number of FEC packets which are contained in one FEC block 171.

In the RTP packet, the total number of-packets is followed by the number of original data packets. The total number of original data packets is denoted by "K" in FIG. 11 and represents the number of RTP packets contained in one FEC block 171.

The number of original data packets is followed by the number of redundant packets, which is denoted by "R" in FIG. 11. The number of redundant packets represents the number of FEC packets contained in one FEC block.

The number of redundant packets is followed by padding, denoted by "P" in FIG. 11, for adjustment of the amount of data. Subsequent to the padding, streaming data is contained. The streaming data is represented as "original data" in FIG. 11.

The FEC packet may be configured in the same manner as the RTP packet. In such a case, the payload type of the FEC packet is, for example, 34.

Referring back to FIG. 10, in step S57, the RTP-packet generator 83 supplies the generated RTP packets to the communication unit 39, which, in turn, transmits the RTP packets to the client 14 over the communications network 13.

In step S58, the FEC-packet generator 84 determines whether or not the operation is in the FEC transmission mode. In step S58, the FEC-packet generator 84 determines whether or not the operation is in the FEC transmission mode, in accordance with, for example, the state of setting of the FEC-transmission-mode flag in the FEC-transmission-mode storing unit 88.

When it is determined in step S58 that the operation is in the FEC transmission mode, the communications network 13 is in a congestion state and thus packet loss is more likely to occur. Thus, the process proceeds to step S59 in order to transmit the FEC packets to the client 14.

In step S59, the FEC-packet generator 84 generates a number of FEC packets which is indicated by an FEC packet count supplied from the FEC-packet-count holding unit 89, based on data in the RTP packets supplied from the RTP-packet generator 83.

In step S59, for example, the FEC-packet generator 84 performs an XOR operation on the data contained in the RTP packets, supplied from the RTP-packet generator 83, to thereby generate data for FEC packets. The FEC-packet generator 84 then adds a predetermined header to the generated data to thereby generate FEC packets.

The header added to the FEC packet has, for example, the same format as the header of the RTP packet shown in FIG. 11. The RTP packet and the FEC packet can be identified by specifying the extension information, denoted by "X" in FIG. 1, in the header of the FEC packet to "1". Further, for example, the payload type of the FEC packet is 34 and the field represented as "original data" in FIG. 11 contains redundant data for error correction.

An error correction scheme (a scheme for redundant data) for FEC packets generated by the FEC-packet generator 84 is not limited to the XOR operation, and another scheme may be used. Examples include linear coding such as Hamming coding, cyclic coding, arithmetic coding such as BCH (Bose-Chaudhuri-Hocquenghem) coding or Reed-Solomon coding, or majority logic coding.

In step S60, the FEC-packet generator 84 supplies the generated FEC packets to the communication unit 39, which, in turn, transmits the FEC packets to the client 14 over the communications network 13. The process then proceeds to step S61.

More specifically, in step S57, the communication unit 39 temporarily holds the RTP packets supplied from the RTP-packet generator 83. Then, in step S60, when an FEC packet or packets containing the same FEC block ID as the FEC block ID contained in the held RTP packets is supplied from the FEC-packet generator 84, the communication unit 39 transmits, as one FEC block 171, the RTP packets held by the communication unit 39 and the FEC packets supplied from the FEC-packet generator 84, to the client 14 over the communications network 13.

For example, from time t1 to time t2 shown in FIG. 8, the server 12 transmits the RTP packets together with the FEC packets to the client 14 over the communications network 13, since the communications network 13 is in a congestion state (i.e., the operation is in the FEC-packet transmission mode).

On the other hand, when it is determined in step S58 that the operation is not in the FEC transmission mode, the communications network 13 is in a non-congestion state and thus packet loss is less likely to occur. Thus, the process skips processing in steps S59 and S60 in order to suppress the FEC-packet transmission to the client 14 and proceeds to step S61.

When it is determined in step S58 that the operation is not in the FEC transmission mode, the transmission of FEC packets is suppressed and thus the communication unit 39 transmits, as one FEC block 171, the RTP packets supplied from the RTP-packet generator 83, to the client 14 over the communications network 13 in step S57.

For example, from time t2 to time t3 shown in FIG. 8, the server 12 transmits, as one FEC block 171, the RTP packet group 181 to the client 14 over the communications network 13, since the communications network 13 is in a non-congestion state. In other words, the server 12'suppresses the transmission of FEC-packets to the client 14, since the operation is not in the FEC-packet transmission mode.

In step S61, the RTP-packet generator 83 updates the FEC block ID. In step S61, for example, the RTP-packet generator 83 increments the FEC block ID to be contained in packets.

In step S62, the RTP-packet generator 83 updates the timestamp.

The FEC-packet generator 84 may generate an FEC packet or FEC packets in accordance with the FEC block ID and the timestamp contained in the RTP header information supplied from the RTP-packet generator 83. Alternatively, the FEC-packet generator 84 itself may hold and update the RTP timestamp and the FEC block ID.

In step S63, the decoder 81 sets the internal timer. The process then returns to step S52 and the above-described data transmission is repeated.

In step S63, the decoder 81 sets the timer value to, for example, zero millisecond.

As described above, the server 12 adds an FEC block ID to each FEC block 171, and when the communications network 13 is in a congestion state, the server 12 transmits RTP packets and FEC packets to the client 14 over the communications network 13. On the other hand, when the communications network 13 is in a non-congestion state, the server 12 transmits RTP packets to the client 14 over the communications network 13 and suppresses the transmission of FEC packets.

Processing in which the server 12 that executes a server program transmits FEC packets is described next with reference to a flow chart shown in FIG. 12.

First, in step S81, the server 12 initializes data needed for processing for controlling the transmission of FEC packets. In step S81, the RTT measuring unit 85 sets the value of an internal timer to, for example, zero millisecond.

In step S82, the FEC transmission controller 86 determines whether or not an FEC feedback packet is received. When it is determined that an FEC feedback packet is received, the process proceeds to step S83. In step S83, the FEC transmission controller 86 performs processing to update the number-of-FEC-packet increase/reduction state held in the number-of-FEC-packet increase/reduction-state holding unit 87. After the update processing is completed, the process returns to step S82 and the processing for controlling FEC-packet transmission is repeated.

Details of the processing for updating the number-of-FEC-packet increase/reduction state will be described later.

On the other hand, when it is determined in step S82 that no FEC feedback packet is received, the process proceeds to step S84. In step S84, the FEC-packet generator 84 determines whether or not the RTT measuring unit 85 has received an RTT measurement packet.

When it is determined in step S84 that an RTT measurement packet is received, the process proceeds to step S85. In step S85, the RTT measuring unit 85 calculates delay time (RTT) in accordance with the received RTT measurement packet. Further, in accordance with the calculated delay time, the long-range dependent RTT calculating unit 103 of the RTT measuring unit 85 calculates long-range dependent RTT and the short-range dependent RTT calculating unit 104 of the RTT measuring unit 85 calculates short-range dependent RTT. The RTT measuring unit 85 then supplies the calculated long-range dependent RTT and short-range dependent RTT to the congestion/non-congestion determining unit 105 of the FEC transmission controller 86.

In step S85, the RTT measuring unit 85 calculates the delay time according to, for example, Equation (1):

$$\text{Delay Time} = (\text{Reception time of } RTT \text{ measurement packet}) - (\text{Transmission time of RTT measurement packet}) \quad (1)$$

The reception time of an RTT measurement packet is provided by an internal RTC (real time clock), when the RTT measuring unit 85 receives the RTT measurement packet. The transmission time of an RTT measurement packet is contained in the received RTT measurement packet.

In step S85, the long-range dependent RTT calculating unit 103 of the RTT measuring unit 85 calculates the long-range dependent RTT according to, for example, Equation (2):

$$\text{Long-range dependent } RTT = 0.9 \times (\text{Previously calculated long-range dependent } RTT) + 0.1 \times (\text{Delay time}) \quad (2)$$

The previously calculated long-range dependent RTT is long-range dependent RTT calculated in the processing in step S85 last time. The delay time is delay time calculated by the RTT measuring unit 85.

In step S85, the short-range dependent RTT calculating unit 104 of the RTT measuring unit 85 calculates the short-range dependent RTT according to, for example, Equation (3):

$$\text{Short-range dependent } RTT = 0.5 \times (\text{Previously calculated short-range dependent } RTT) + 0.5 \times (\text{Delay time}) \quad (3)$$

The previously calculated short-range dependent RTT is short-range dependent RTT calculated in the processing in step S85 last time. The delay time is delay time calculated by the RTT measuring unit 85.

For example, in the processing in step S85, the long-range dependent RTT calculating unit 103 and the short-range dependent RTT calculating unit 104 of the RTT measuring unit 85 store the calculated long-range dependent RTT and short-range dependent RTT, respectively. Subsequently, in the processing in step S85 next time, the long-range dependent RTT calculating unit 103 and the short-range dependent RTT calculating unit 104 use the stored long-range dependent RTT and short-range dependent RTT to calculate the next long-range dependent RTT and short-range dependent RTT, respectively.

The long-range dependent RTT may be the average delay time in five seconds. The short-range dependent RTT may be the average delay time in one second.

In step S86, the congestion/non-congestion determining unit 105 of the FEC transmission controller 86 compares the long-range dependent RTT and short-range dependent RTT supplied from the RTT measuring unit 85.

In step S86, for example, the congestion/non-congestion determining unit 105 uses the long-range dependent RTT and short-range dependent RTT supplied from the RTT measuring unit 85 compares the long-range dependent RTT with the short-range dependent RTT by performing calculation expressed by Equation (4):

$$(\text{Short-range dependent } RTT)/(\text{Long-range dependent } RTT) > 1 \quad (4)$$

In step S87, the congestion/non-congestion determining unit 105 determines whether or not the communications network 13 is in a congestion state, in accordance with the result of the calculation (in step S86) of Equation (4).

In step S87, for example, when the long-range dependent RTT and short-rage dependent RTT supplied from the RTT measuring unit 85 satisfy Equation (4), the congestion/non-congestion determining unit 105 determines that the communications network 13 is in a congestion state. On the other hand, when the long-range dependent RTT and short-rage dependent RTT supplied from the RTT measuring unit 85 do not satisfy Equation (4), the congestion/non-congestion determining unit 105 determines that the communications network 13 is not in a congestion state.

The congestion state herein refers to a state in which increased traffic in the communications network 13 affects packet transmission. For example, in some cases, packets cannot be properly transmitted in a congestion state. The state of the communications network 13, i.e., whether or not it is in a congestion state, can be indicated by, for example, the buffer queue length at a node in the communications network 13. For example, when the buffer queue length at a node is long, it can be determined that the communications network 13 is congested because of a large number of packets waiting for transmission. Conversely, when the queue length at a node is short, it can be determined that the communications network 13 is not congested because of a small number of packets waiting for transmission.

A predetermined threshold may be provided for the buffer queue length. In such a case, when the buffer queue length is greater than the threshold, it can be determined that the communications network 13 is in a congestion state, and when the buffer queue length is smaller than the threshold, it can be determined that the communications network 13 is in a non-congestion state.

The queue length at a node in the communications network 13 can be observed through the use of, for example, an SNMP (Simple Network Management Protocol).

The present applicant has observed the queue length at a node, the long-range dependent RTT, and the short-range dependent RTT. The result confirmed that the node queue length, the long-range dependent RTT, and the short-range dependent RTT have a certain relationship.

Figure 13:
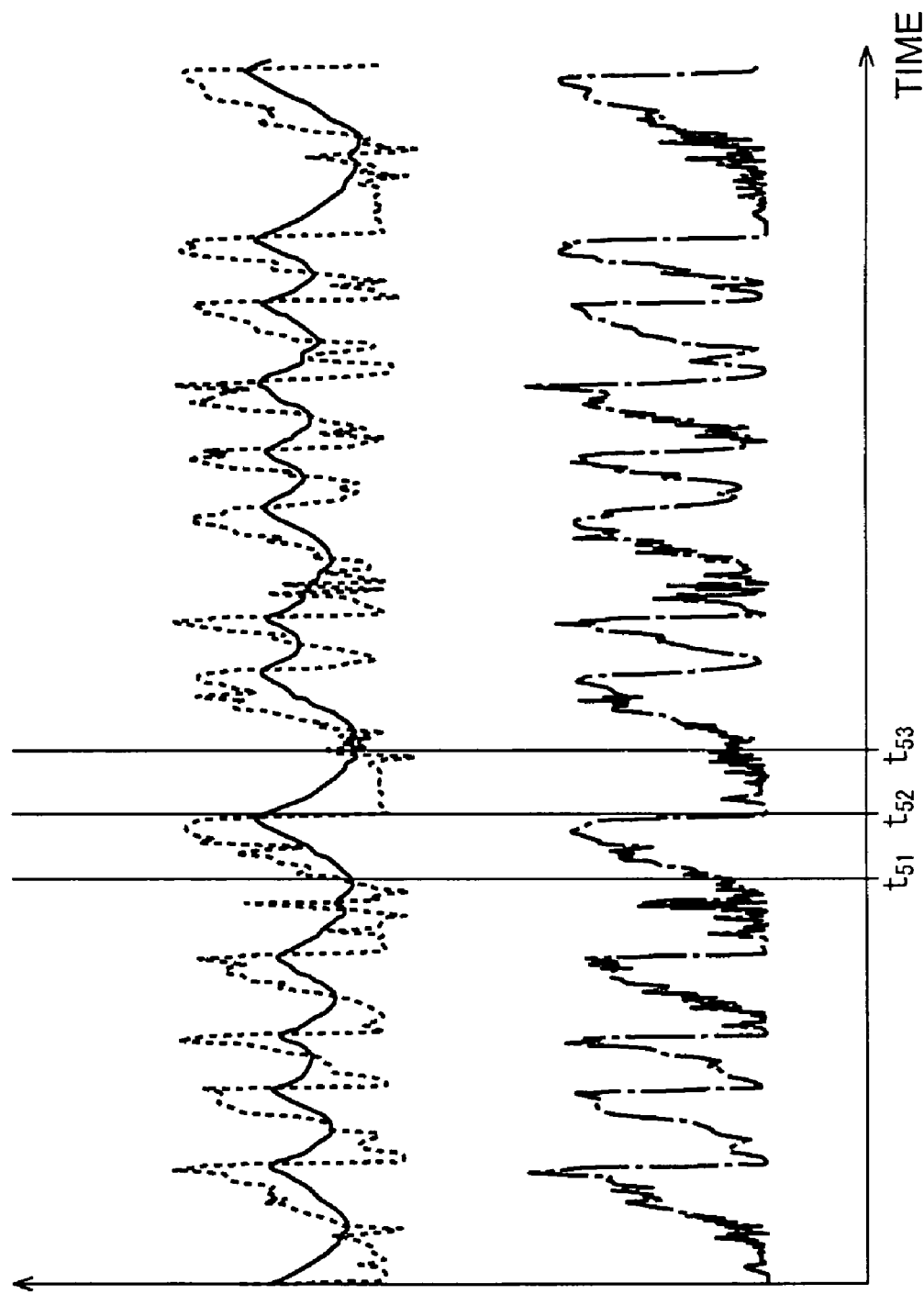
FIG. 13 is a graph illustrating long-range dependent RTT and short-range dependent RTT.

FIG. 13 is a graph illustrating a node queue length, long-range dependent RTT, and short-range dependent RTT.

The horizontal axis in FIG. 13 indicates time. In FIG. 13, the solid line indicates long-range dependent RTT, the dotted line indicates short-range dependent RTT, and the dashed-dotted line indicates a node queue, length.

It can be understood from FIG. 13 that, when a state in which the short-range dependent RTT is greater than the long-range dependent RTT changes to a state in which the long-range dependent RTT is greater than the short-range dependent RTT, the node queue length decreases sharply. For example, it is shown that, at time t52 in FIG. 13, when a state in which the short-range dependent RTT is greater than the long-range dependent RTT changes to a state in which the long-range dependent RTT is greater than the short-range dependent RTT, the node queue length decreases sharply.

Conversely, it can be understood that, when a state in which the short-range dependent RTT is smaller than the long-range dependent RTT changes to a state: in which the short-range dependent RTT is greater than the long-range dependent RTT, the node queue length increases. For example, it is shown that, at time t53 in FIG. 13, when a state in which the short-range dependent RTT is smaller than the long-range dependent RTT changes to a state in which the short-range dependent RTT is greater than the long-range dependent RTT, the node queue length increases.

Accordingly, depending on whether or not the short-range dependent RTT is greater than the long-range dependent RTT, a determination can be made as to whether or not the communications network 13 is in a congestion state. In other words, when the long-range dependent RTT and the short-range dependent RTT satisfy Equation (4), it can be determined that the communications network 13 is in a congestion state, and when they do not satisfy Equation (4), it can be determined that the communications network 13 is in a non-congestion state.

For example, in FIG. 13, a period from time t51 to time t52 can be determined that the communications network 13 is in a congestion state, and a period from t52 to t53 can be determined that the communications network 13 is in a non-congestion state.

Figure 12:
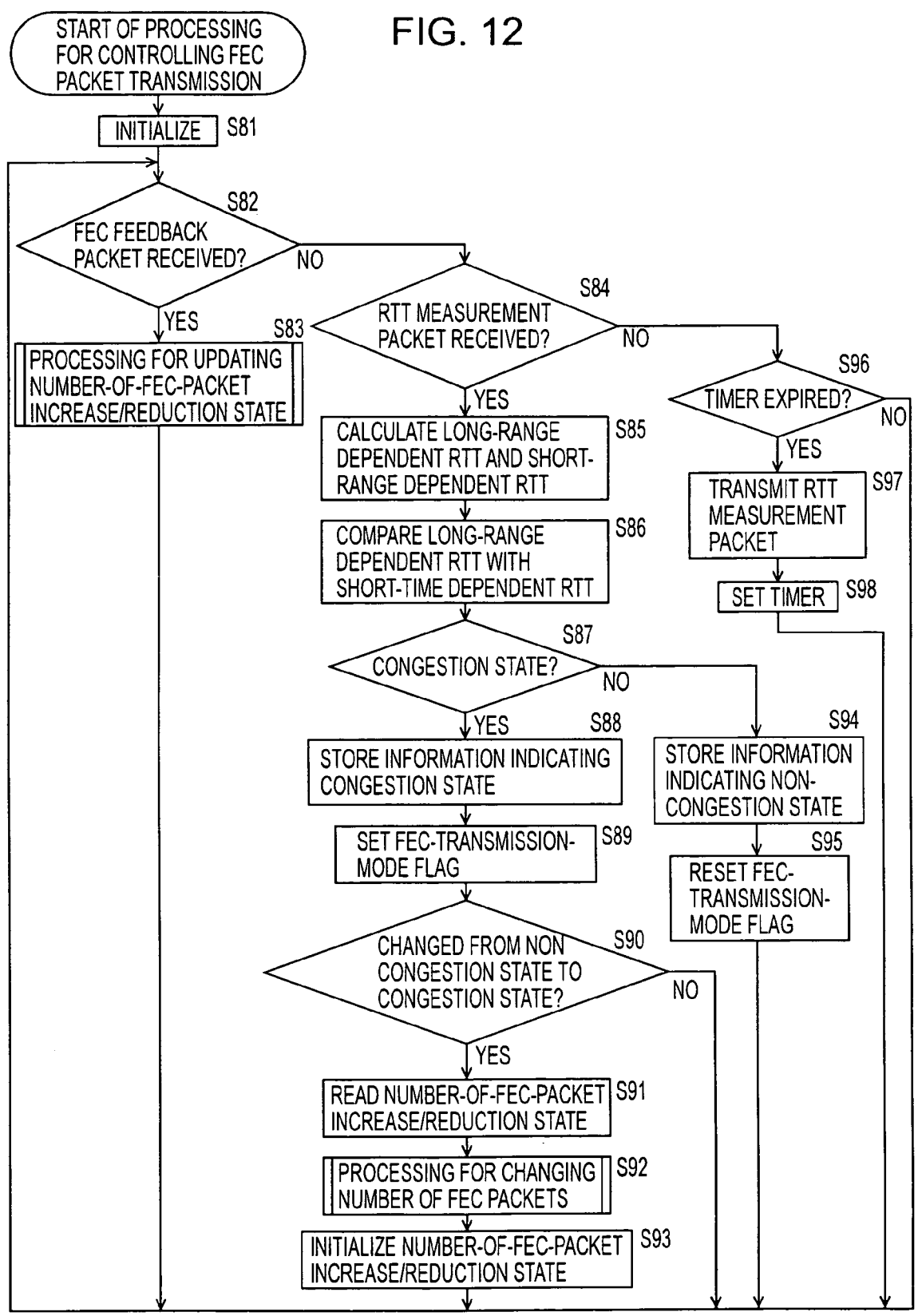
FIG. 12 is a flow chart illustrating processing for controlling FEC packet transmission.

Referring back to the flow chart shown in FIG. 12, in step S87, when it is determined that the communications network 13 is in a congestion state, the process proceeds to step S88. In step S88, the congestion/non-congestion determining unit 105 stores the state in which the communications network 13 is congested, as a congestion/non-congestion state, and supplies a signal indicating the congestion state of the communications network 13 to the FEC transmission controller 86.

The determination processing in step S87 is not necessarily limited to the use of long-range dependent RTT and short-range dependent RTT. For example, an SNMP for observing the traffic state of the communications network 13, jitter, or the rate of packet loss may be used to determine whether or not the communications network 13 is in a congestion state.

In step S89, upon receiving the signal indicating the congestion state of communications network 13 from the congestion/non-congestion determining unit 105, the FEC transmission controller 86 sets the FEC-transmission-mode flag stored in the FEC-transmission-mode storing unit 88.

The FEC transmission mode herein refers to a mode in which FEC packets are transmitted. That is, when it is determined in step S87 that the communications network 13 is in a congestion state, the FEC transmission controller 86 sets the FEC-transmission-mode flag stored in the FEC-transmission-mode storing unit 88. In response, the operation goes into the FEC transmission mode, in which FEC packets is transmitted during the transmission of the FEC block 171.

In step S90, the FEC transmission controller 86 determines whether or not the state of the communications network 13 has changed from a non-congestion state to a congestion state.

In step S90, for example, with reference to the congestion/non-congestion state stored in the congestion/non-congestion determining unit 105, the FEC transmission controller 86 determines whether or not the state of the communications network 13 has changed from the non-congestion state to the congestion state.

In step S90, for example, the FEC transmission controller 86 may determine whether or not the state of the communications network 13 has changed from a non-congestion state to a congestion state, in accordance with the FEC-transmission-mode flag stored in the congestion/non-congestion determining unit 88.

When it is determined in step S90 that the state is changed from the non-congestion state to the congestion state, the process proceeds to step S91. In step S91, the FEC transmission controller 86 reads the number-of-FEC-packet increase/reduction state updated in the processing in step S83 and held by the number-of-FEC-packet increase/reduction-state holding unit 87.

The number-of-FEC-packet increase/reduction-state holding unit 87 holds any of, for example, the three states, namely, an 'increase' state, a 'maintain' state, and a 'reduction' state as the number-of-FEC-packet increase/reduction state. That is, the increase state indicates that the server 12 increases the number of FEC packets contained in the FEC block 171 to be transmitted to the client 14 over the communications network 13. The maintain state indicates that the server 12 maintains (i.e., does not change) the number of FEC packets contained in the FEC block 171 to be transmitted to the client 14 over the communications network 13. The reduce state indicates that the server 12 increases the number of FEC packets contained in the FEC block 171 to be transmitted to the client 14 over the communications network 13.

The number-of-FEC-packet increase/reduction state held in the number-of-FEC-packet increase/reduction-state holding unit 87 is updated every time an FEC feedback packet is received from the client 14 over the communications network 13.

In step S92, the FEC transmission controller 86 performs processing for changing the number of FEC packets, in accordance with the read number-of-FEC-packet increase/reduction state. Details of the processing for changing the number of FEC packets will be described later.

The number of FEC packets here refers to the number of FEC packets contained in one FEC block 171 to be transmitted from the server 12 to the client 14 over the communications network 13. For example, in FIG. 8, the number of FEC packets transmitted from the server 12 in a period from time t1 to time t2 is two.

In step S93, the FEC transmission controller 86 initializes the number-of-FEC-packet state held in the number-of-FEC-packet increase/reduction-state holding unit 87. The process then returns to step S82 and the processing for controlling FEC packet transmission is repeated.

In step S93, the FEC transmission controller 86 initializes the number-of-FEC-packet state by setting, for example, the maintain state for the number-of-FEC-packet increase/reduction state held in the number-of-FEC-packet increase/reduction-state holding unit 87.

On the other hand, when it is determined in step S90 that the state has not changed from a non-congestion state to a congestion state, the process skips the processing in steps S91 to S93 and returns to step S82, from which the processing for controlling FEC packet transmission is repeated.

Also, when it is determined in step S87 that the communications network 13 is not in a congestion state, the process proceeds to step S94. In step S94, the congestion/non-congestion determining unit 105 stores the state in which the communications network 13 is not congested, as the congestion/non-congestion state, and supplies a signal that indicates the non-congestion state of the communications network 13 to the FEC transmission controller 86.

In step S95, upon receiving the signal indicating the non-congestion state of communications network 13 from the congestion/non-congestion determining unit 105, the FEC transmission controller 86 resets the FEC-transmission-mode flag stored in the FEC-transmission-mode storing unit 88. As a result of the resetting of the FEC-transmission-mode flag in the FEC-transmission-mode storing unit 88, the operation goes out of the FEC transmission mode and thus FEC packets are not transmitted during the transmission of the FEC block 171.

After the FEC transmission controller 86 resets the FEC-transmission-mode flag, the process returns to step S82 and the processing for controlling FEC packet transmission is repeated.

When it is determined in step S84 that the RTT measuring unit 85 has not received an RTT measurement packet, the process proceeds to step S96. In step S96, the RTT measuring unit 85 determines whether or not the internal timer has expired.

In step S96, the RTT measuring unit 85 determines whether or not the timer has expired, for example, by comparing the timer value with a predetermined value, such as 10 milliseconds.

When it is determined in step S96 that the timer has not expired, the process returns to step S82 and the processing for controlling FEC-packet transmission is repeated.

On the other hand, when it is determined in step S96 that the timer has expired, the process proceeds to step S97. In step S97, the RTT measuring unit 85 generates an RTT measurement packet and transmits the generated RTT measurement packet to the client 14 over the communications network 13.

In step S97, for example, the RTT measuring unit 85 obtains current time from the internal RTC (real-time clock) to generate an RTT measurement packet shown in FIG. 14.

FIG. 14 illustrates an RTT measurement packet. Since the version information, padding, and SSRC are analogous to those of the RTP packet shown in FIG. 11, the descriptions thereof are not given.

In the RTT measurement packet, the padding is followed by a 5-bit subtype.

The RTT measurement packet has a payload type of 205. The payload type is followed by a 16-bit message length, which indicates the length (size) of the RTT measurement packet.

The 32-bit SSRC is followed by a 32-bit Name. The Name, for example, includes the name of an application program for handling the RTT measurement packet.

In the RTT measurement packet, the Name is followed by a transmission time, which indicates time at which the server 12 transmits the RTT measurement packet to the client 14. The transmission time includes, for example, the time that the RTT measuring unit 85 obtains from the internal RTC in step S97.

Referring back to the flow chart shown in FIG. 12, in step S98, the RTT measuring unit 85 sets the internal timer. The process then returns to step S82 and the processing described above is repeated.

In step S98, the RTT measuring unit 85 sets the value of the internal timer to, for example, zero millisecond.

As described above, the server 12 performs processing for controlling FEC-packet transmission.

Figure 15:
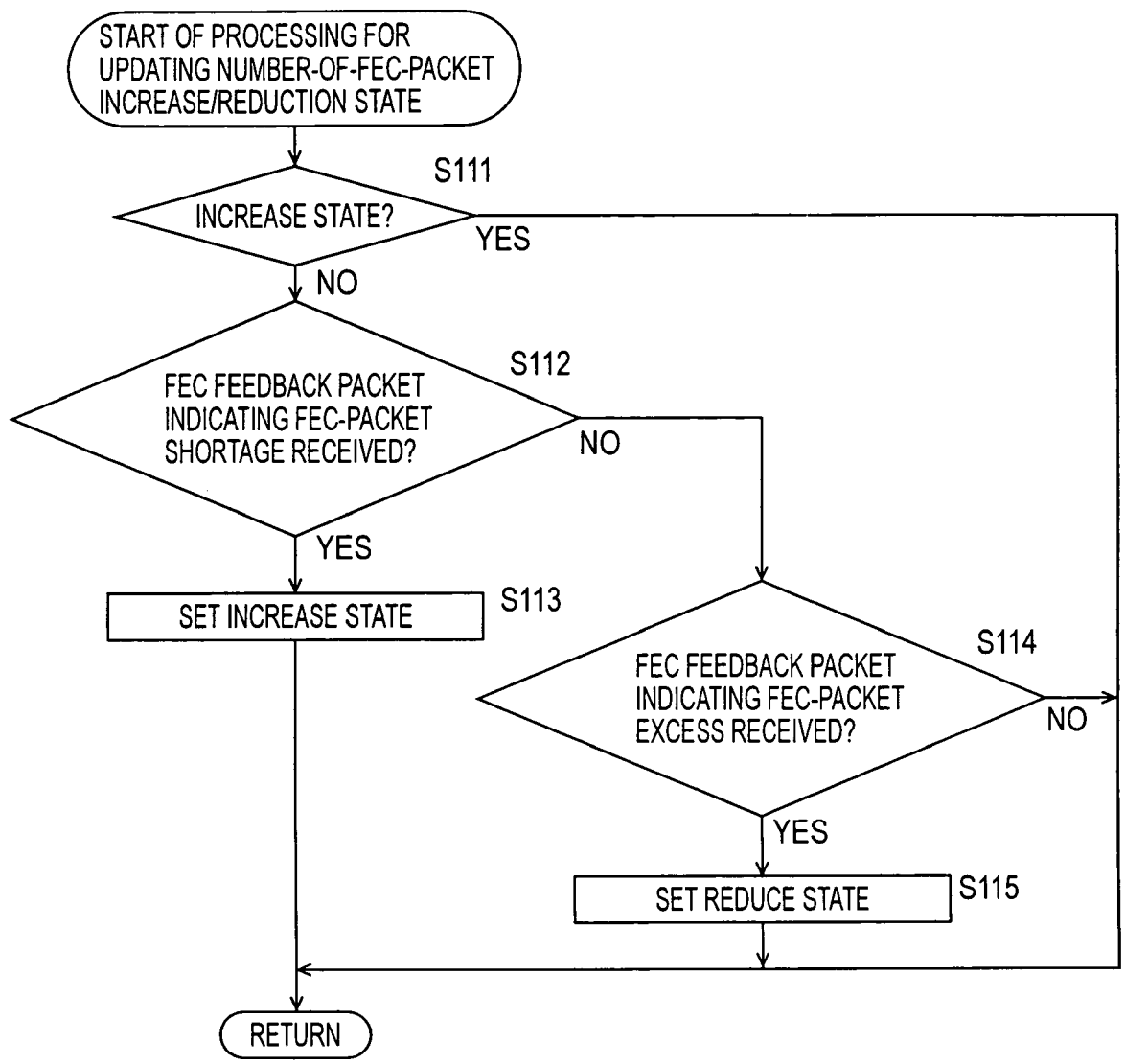
FIG. 15 is a flow chart illustrating processing for updating a number-of-FEC-packet increase/reduction state.

Next, the processing in step S83 shown in FIG. 12, i.e., the processing for updating the number-of-FEC-packet increase/reduction state, is described in detail with reference to a flow chart shown in FIG. 15.

In step S111, the FEC transmission controller 86 determines whether or not the number-of-FEC-packet increase/reduction state held in the number-of-FEC-packet increase/reduction-state holding unit 87 indicates an increase state.

When it is determined in step Sill that the number-of-FEC-packet increase/reduction state indicates an increase state, the FEC transmission controller 86 does not update the setting of the number-of-FEC-packet increase/reduction state held in the number-of-FEC-packet increase/reduction-state holding unit 87 and ends the processing for updating the number-of-FEC-packet increase/reduction state.

On the other hand, when it is determined in step Sill that the number-of-FEC-packet increase/reduction state does not indicate an increase state, the process proceeds to step S112. In step S112, the FEC transmission controller 86 determines whether or not an FEC feedback packet indicating a shortage of FEC packets is received.

As described above, the FEC feedback packet is transmitted from the client 14 over the communications network 13. For example, in FIG. 8, the client 14 transmits FEC feedback packets to the server 12 over the communications network 13 at time t23, time t24, time t25, and time t26, respectively.

The FEC feedback packet contains a notification FEC state that indicates whether the number of FEC packets received by the client 14 is insufficient, adequate, or excessive for the client 14 to restore lost packets.

When it is determined in step S112 that the FEC feedback packet indicating a shortage of FEC packets is received, the process proceeds to step S113. In this case, since the number of FEC packets is insufficient at the client 14, in step S113, the FEC transmission controller 86 sets an increase state for the number-of-FEC-packet increase/reduction state held in the number-of-FEC-packet increase/reduction-state holding unit 87.

On the other hand, when it is determined in step S112 that an FEC feedback packet indicating a shortage of FEC packets is not received, the process proceeds to step S114. In step S114, the FEC transmission controller 86 determines whether or not an FEC feedback packet indicating an excess of FEC packets has been received.

When it is determined in step S114 that an FEC feedback packet indicating an excess of FEC packets is received, the process proceeds to step S115. In this case, since the number of FEC packets received by the client 14 is excessive, the FEC transmission controller 86 sets a reduce state for the number-of-FEC-packet increase/reduction state and ends the processing.

Also, when it is determined in step S114 that an FEC feedback packet indicating an excess of FEC packets has not been received, the FEC transmission controller 86 does not update the number-of-FEC-packet increase/reduction state and ends the processing.

That is, in a period after the FEC transmission controller 86 initializes the number-of-FEC-packet increase/reduction state in the processing in step S93 shown in FIG. 12 until when an RTT measurement packet is received, when an FEC feedback packet indicating a shortage of FEC packets is received even once, the FEC transmission controller 86 sets an increase state for the number-of-FEC-packet state. On the other hand, in that period, when only an FEC feedback packet indicating the adequate state of FEC packets is received, the FEC transmission controller 86 sets an maintain state for the number-of-FEC-packet state. Also, when an FEC feedback packet indicating an adequate number of FEC packets and an FEC feedback packet indicating an excess of FEC packets are received, the FEC transmission controller 86 sets a reduce state for the number-of-FEC-packet state.

In such a manner, the FEC transmission controller 86 updates the number-of-FEC-packet increase/reduction state, every time an FEC feedback packet is received from the client 14.

Figure 16:
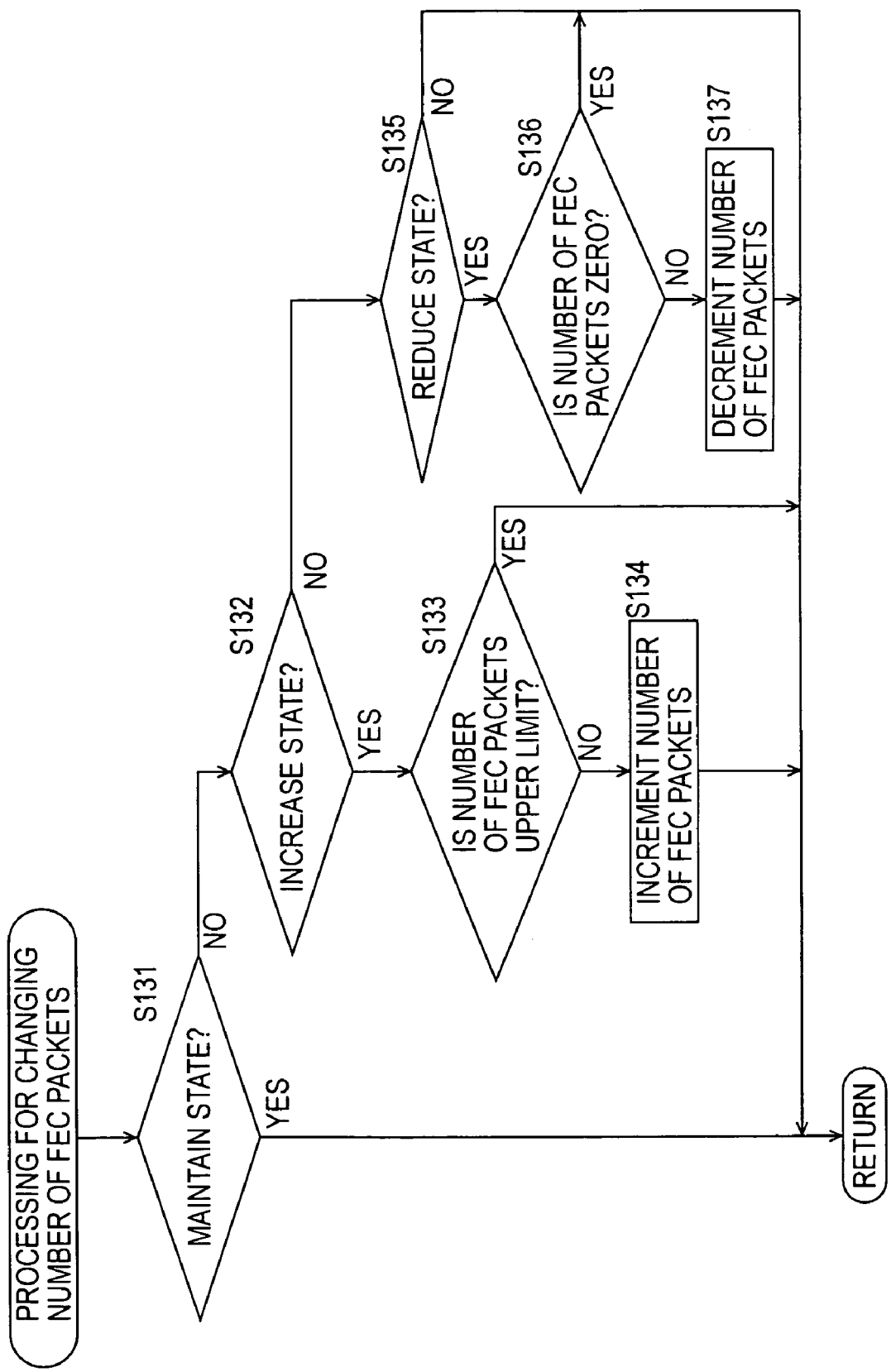
FIG. 16 is a flow chart illustrating processing for changing the number of FEC packets.

Next, the processing in step S92 shown in FIG. 12, i.e., the processing for changing the number of FEC packets, is described in detail with reference to a flow chart shown in FIG. 16.

In step S131, the FEC transmission controller 86 determines whether or not the number-of-FEC-packet increase/reduction state stored in the number-of-FEC-packet increase/reduction-state holding unit 87 indicates a maintain state. When it is determined that the number-of-FEC-packet increase/reduction state indicates a maintained state, the FEC transmission controller 86 does not change the number of FEC packets and ends the processing.

On the other hand, when it is determined in step S131 that the number-of-FEC-packet increase/reduction state stored in the number-of-FEC-packet increase/reduction-state holding unit 87 does not indicate a maintain state, the process proceeds to step S132. In step S132, the FEC transmission controller 86 determines whether or not the number-of-FEC-packet increase/reduction state stored in the number-of-FEC-packet increase/reduction-state holding unit 87 indicates an increase state.

When it is determined in step S132 that the number-of-FEC-packet increase/reduction state indicates an increase state, the process proceeds to step S133. In step S133, the FEC transmission controller 86 determines whether or not the FEC packet count held in the FEC-packet-count holding unit 89 is its upper limit.

When it is determined in step S133 that the FEC packet count is not its upper limit, the process proceeds to step S134. In step S134, the FEC transmission controller 86 increments the number of FEC packets.

When it is determined in step S133 that the FEC packet count held in the FEC-packet-count holding unit 89 is its upper limit, the number of packets cannot be increased any more, so that the FEC transmission controller 86 doe not change the number of FEC packets and ends the processing.

When it is determined in step S132 that the number-of-FEC-packet increase/reduction state stored in the number-of-FEC-packet increase/reduction-state holding unit 87 does not indicate an increase state, the process proceeds to step S135. In step S135, the FEC transmission controller 86 determines whether or not the number-of-FEC-packet increase/reduction state stored in the number-of-FEC-packet increase/reduction-state holding unit 87 indicates a reduce state.

When it is determined in step S135 that the number-of-FEC-packet increase/reduction state indicates a reduce state, the process proceeds to step S136. In step: S136, the FEC transmission controller 86 determines whether or not the FEC packet count held in the FEC-packet-count holding unit 89 is zero.

When it is determined in step S136 that the FEC packet count is not zero, the process proceeds to step S137. In step S137, the FEC transmission controller 86 decrements the number of FEC packets and ends the processing.

On the other hand, when it is determined in step S136 that the FEC packet is zero, the FEC transmission controller 86 does not change the number of FEC packets and ends the processing, since the number of FEC packets cannot be reduced any more.

When it is determined in step S135 that the number-of-FEC-packet increase/reduction state stored in the number-of-FEC-packet increase/reduction-state holding unit 87 does not indicate a reduce state, the FEC transmission controller 86 does not change the number of FEC packets and ends the processing.

As described above, the FEC transmission controller 86 changes the number of FEC packets which is held in the FEC-packet-count holding unit 89.

Figure 17:
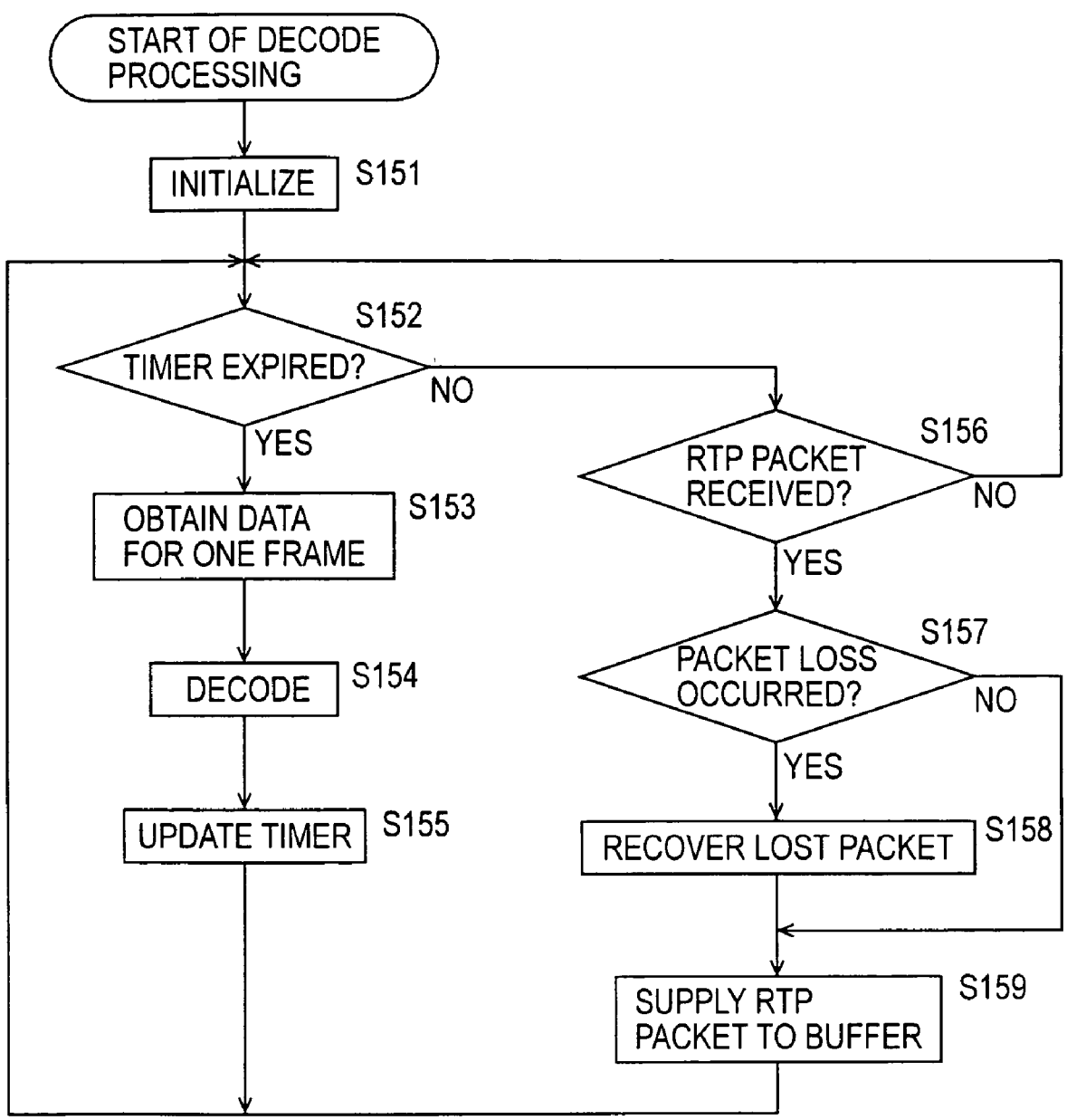
FIG. 17 is a flow chart illustrating decode processing.

Processing in which the client 14 that executes a client program performs decode processing is described next with reference to a flow chart shown in FIG. 17.

First, in step S151, the decoder 134 initializes data needed for decode processing. In step S151, for example, the decoder 134 enters a standby mode to standby for a period of 500 milliseconds and waits until when the buffer 133 stores a predetermined amount of video data.

For example, when the number of frames-in video data is 30 per second, in step S151, the decoder 134 determines whether or not the timer has expired by setting the value of an internal timer to zero millisecond and comparing the timer value with a predetermined value, for example, 33 milliseconds.

That is, in step S152, the decoder 134 determines whether or not the timer has expired, in accordance with the timer value, and when it is determined that the timer has expired, the process proceeds to step S153. In step S153, the decoder 134 obtains data for one frame from the buffer 133. In step S154, the decoder 134 decodes the data obtained in the processing in step S153 and outputs resulting video data.

In step S155, the decoder 134 sets the internal timer. The process then returns to step S151 and the above-described decode processing is repeated. In step S155, the decoder 134 sets the timer value to, for example, zero millisecond.

On the other hand, when it is determined in step S152 that the timer has not expired, the process proceeds to step S156. In step S156, the RTP processor 132 determines whether or not RTP packets have been received.

When it is determined in step S156 that RTP packets have not been received, the process returns to step S152 and the decode processing is repeated.

When it is determined in step S156 that RTP packets have been received, the process proceeds to step S157. In step S157, by inspecting the received RTP packets, the RTP processor 132 determines whether or not packet loss has occurred.

When it is determined in step S157 that packet loss has occurred, the process proceeds to step S158, in which the FEC processor 135 recovers a lost packet or lost packets.

In step S158, for example, when an FEC packet containing the same FEC block ID as the FEC packet ID of a lost packet is supplied from the RTP processor 132, the FEC processor 135 recovers a lost packet in accordance with the supplied FEC packet and supplies the recovered RTP packet to the RTP processor 132.

In step S158, when no FEC packet is supplied or the number of supplied FEC packets is insufficient relative to the number of lost packets, the FEC processor 135 cannot recover a lost packet or packets corresponding to the number of shortage of the FEC packet(s) and thus does not recover the lost packet(s).

When it is determined in step S157 that no packet loss has occurred, the process skips the processing in step S158 and proceeds to step S159, since the RTP-packet recovery is not necessary.

In step S159, the RTP processor 132 supplies the received RTP packets and the recovered RTP packet(s) to the buffer 133. The process then returns to step S152 and the above described processing is repeated.

As described above, the decoder 134 performs decode processing.

Figure 18:
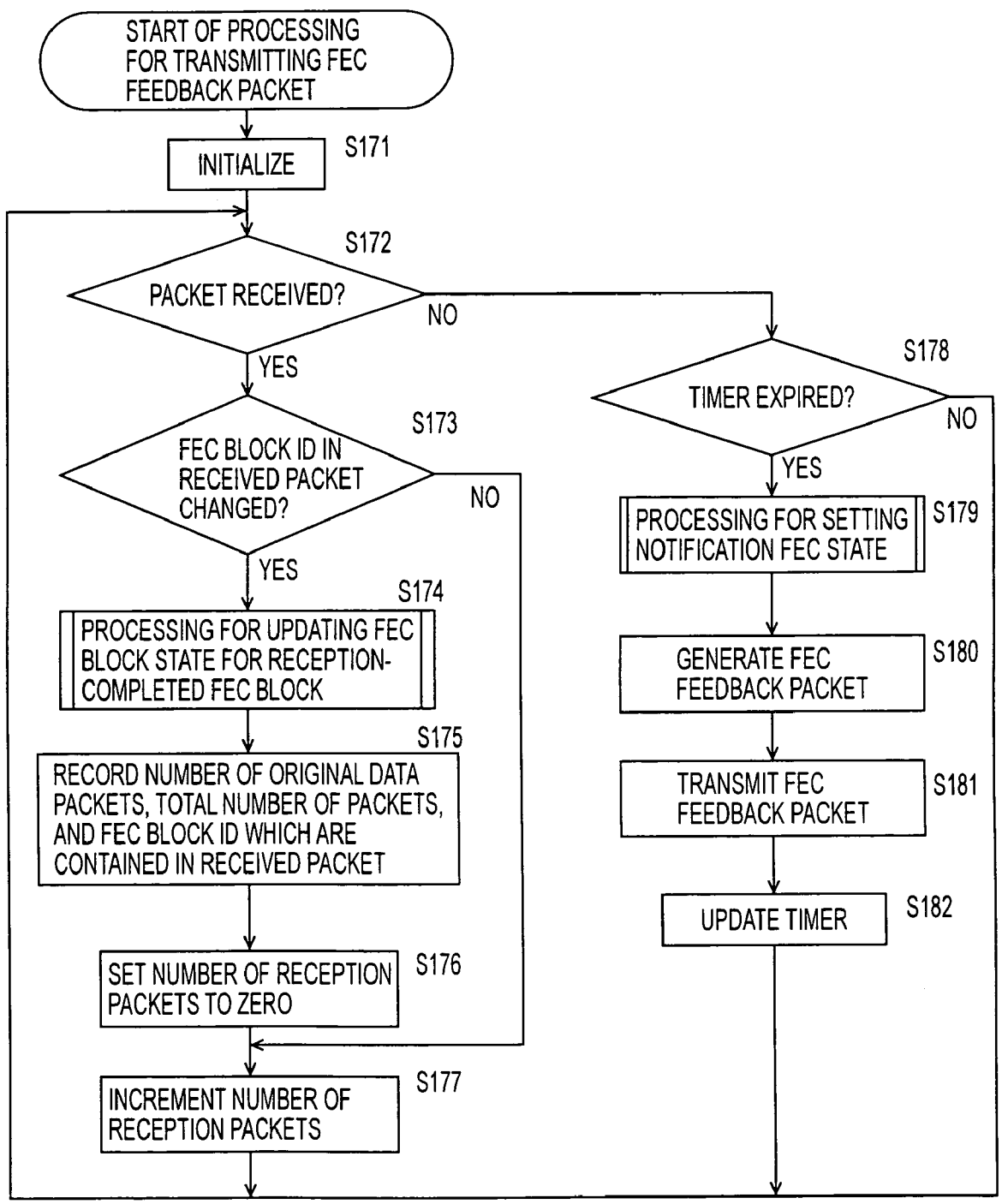
FIG. 18 is a flow chart illustrating processing for transmitting an FEC feedback packet.

Next, processing in which the client 14 that executes a client program performs processing for transmitting an FEC feedback packet is described with reference to a flow chart shown in FIG. 18.

In step S171, the client 14 initializes data needed for processing for transmitting an FEC feedback packet. In step S171, for example, the FEC processor 135 initializes FEC block information, which is described below, and sets the value of an internal timer to zero millisecond.

In step S172, the RTP processor 132 determines whether or not packets have been received.

When it is determined in step S172 that packets have been received, the process proceeds to step S173. In step S173, the RTP processor 132 determines whether or not the FEC block ID of the received packets has changed. When it is determined in step S173 that the FEC block ID of the received packets has changed, the process proceeds to step S174. In step S174, the FEC processor 135 performs processing for updating the FEC block state for a reception-completed FEC block 171.

The reception-completed FEC block 171 here refers to one FEC block 171 containing an FEC block ID that is immediately prior to the FEC block ID that was determined to have changed in step S173. The FEC-block-state update processing is performed based on both the number of packets contained in one FEC block 171 transmitted from the server 12 over the communications network 13 and the number of packets received properly. Thus, the processing can be executed when the reception of all packets contained in the FEC block 171 is completed.

Thus, in step S173, for example, a determination is made as to whether or not the reception of all packets contained in the FEC block 171 is completed, based on whether the FEC block ID of the received packets changes.

Details of the FEC-block-state update processing in step S174 will be described later.

In step S175, the RTP processor 132 records the number of original data packets, the total number of packets, and the FEC block ID which are contained in the received packets to the FEC-block-information holding unit 136 as FEC block information.

For example, the number of original data packets corresponds to "K" of the RTP packet shown in FIG. 11 and the total number of packets corresponds to "N" of the RTP packet shown in FIG. 11. The FEC block information is also recorded to, for example, the FEC-block-information table shown in FIG. 9.

Referring to FIG. 11, the number of original data packets (indicated by "K") of the RTP packets is associated with the FEC block ID and is stored as the number of original data packets for the FEC block information shown in FIG. 9. The FEC block ID of the RTP packet shown in FIG. 11 is stored as the FEC block ID for the FEC block information shown in FIG. 9. The total number of packets (indicated by "N" in FIG. 11) is associated with the FEC block ID and is stored as the total number of packets for the FEC block information shown in FIG. 9.

The packets that have been determined in step S173 that the FEC block ID thereof has changed are subjected to the processing in step S175. That is, the FEC block ID processed in step S174 and the FEC block ID of an FEC block processed in the processing in step S175 are different from each other.

In step S176, the RTP processor 132 sets the number of reception packets, which is shown in the FEC-block-information table recorded in the FEC-block-information holding unit 136, to zero.

Also, when it is determined in step S173 that the FEC block ID has not changed, the process skips the processing of step S174 to step S176 and proceeds to step S177.

In step S177, the RTP processor 132 increments the number of reception packets, which is shown in the FEC-block-information table recorded in the FEC-block-information holding unit 136. The process then returns to step S172 and the FEC-feedback-packet transmission processing is repeated.

When it is determined in step S172 that packets have not been received, the process proceeds to step S178. In step S178, the FEC processor 135 determines whether or not the internal timer has expired.

In step S178, the FEC processor 135 may determine whether or not the timer has expired by comparing the value of the internal timer with a predetermined value, for example, 100 milliseconds.

When it is determined in step S178 that the timer has not expired, the process returns to step S172 and the FEC-feedback-packet transmission processing is repeated.

On the other hand, when it is determined in step S178 that the timer has expired, the process proceeds to step S179. In step S179, the FEC processor 135 performs processing for setting a notification FEC state to be issued to the server 12.

In step S179, the FEC processor 135 performs processing for setting the notification FEC state, based on the state of all FEC block states recorded in the FEC-block-information table held by the FEC-block-information holding unit 136. Details of the processing for setting the notification FEC state will be described later.

In step S180, the FEC-feedback-packet generator 153 of the FEC processor 135 generates an FEC feedback packet based on the notification FEC state set in step S179.

FIG. 19 illustrates an FED feedback packet. Since the version information, padding, and subtype, message length, SSRC, and Name are analogous to those of the RTT measurement packet shown in FIG. 14, the descriptions thereof are not given.

The FEC feedback packet has a payload type of 204.

In the FEC feedback packet, the notification FEC state, which follows the Name, is issued to a receiving side. In the processing in step S179 shown in FIG. 18, the FEC-feedback-packet generator 153 performs setting such that the notification FEC state indicates one of, for example, an adequate state, excess state, and shortage state.

Referring back to FIG. 18, in step S181, the FEC-feedback-packet generator 153 supplies the generated FEC feedback packet to the communication unit 131. Upon receiving the FEC feedback packet supplied from the FEC-feedback-packet generator 153, the communication unit 131 transmits the FEC feedback packet to the server 12 over the communications network 13.

In step S182, the FEC processor 135 updates the internal timer. The process then returns to step S172 and the above-described processing is repeated.

In step S182, the FEC processor 135 sets the value of the internal timer to, for example, zero millisecond.

As described above, the FEC processor 135 transmits the FEC feedback packet to the server 12 over the communications network 13 at a predetermined time interval. The value "100 milliseconds" that is compared to the timer value in step S178 is merely one example of a period corresponding to times T1, T2, T3, and T4 shown in FIG. 8 and is not intended to limit the present invention.

Figure 20:
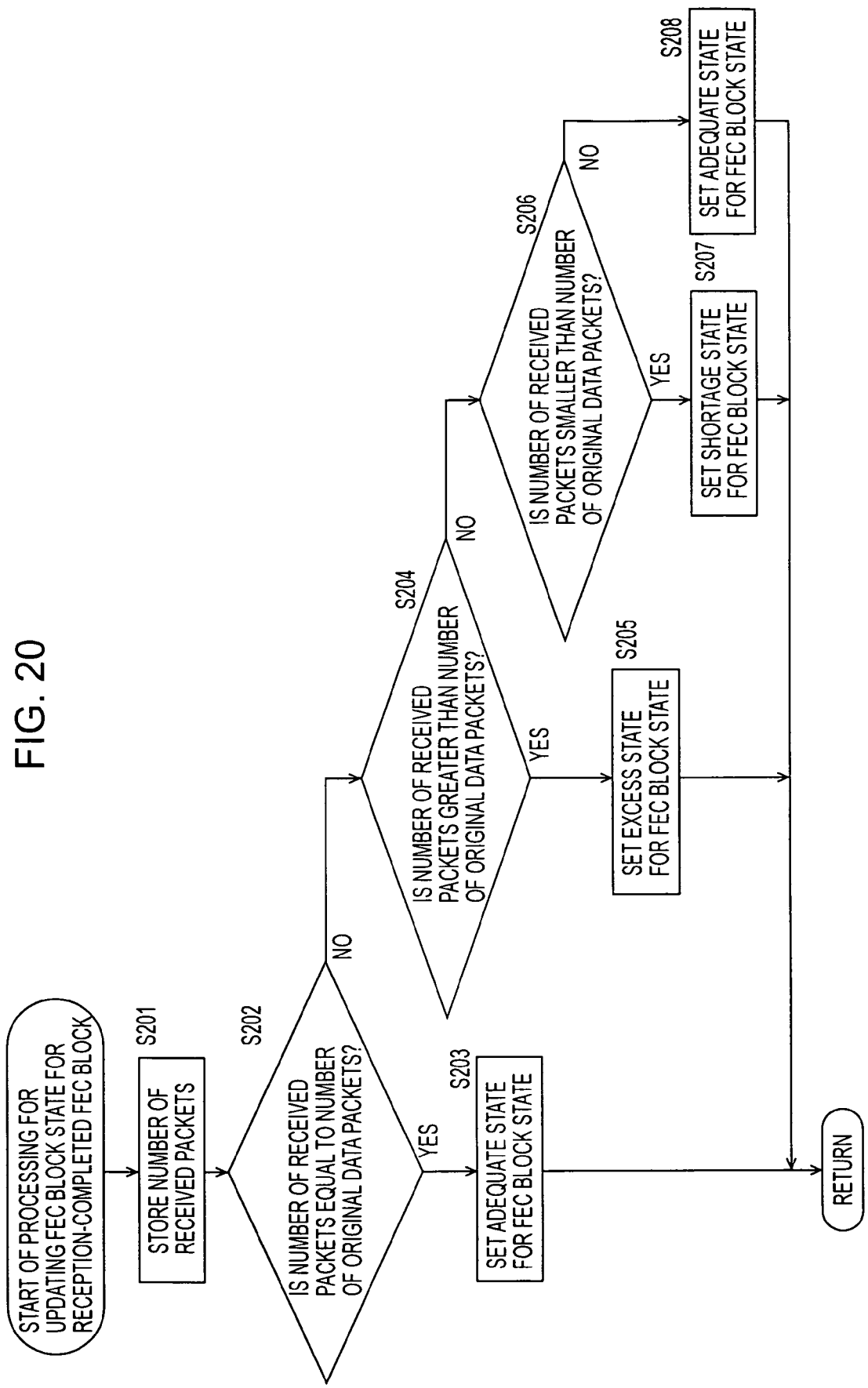
FIG. 20 is a flow chart illustrating processing for updating an FEC block state for a reception-completed block.

Next, the processing in step S174 shown in FIG. 18, i.e., the processing for updating the FEC block state for the reception-completed FEC block 171, is described in detail with reference to a flow chart shown in FIG. 20.

In step S201, the RTP processor 132 stores (records) the number of received packets in the reception-completed FEC block 171 into the FEC-block-information table held by the FEC-block-information holding unit 136.

In step S202, the RTP processor 135 determines whether or not the number of received packets in the reception-completed FEC block 171 is equal to the number of original data packets, in accordance with the FEC-block-information table held by the FEC-block-information holding unit 136.

When it is determined in step S202 that the number of received packets is equal to the number of original data packets, the process proceeds to step S203 since the number of FEC packets for recovery of an RTP packet or RTP packets is neither insufficient nor excessive. In step S203, the FEC processor 135 sets an adequate state for the FEC block state in the FEC-block-information table held by the FEC-block-information holding unit 136 and then ends the processing.

When it is determined in step S202 that the number of received packets is not equal to the number of original data packets, the process proceeds to step S204. In step S204, the FEC processor 135 determines whether or not the number of received packets is greater than the number of original data packets.

When it is determined in step S204 that the number of received packets is greater than the number of original data packets, the process proceeds to step S205 since the number of FEC packets for recovery of an RTP packet or RTP packets is excessive. In step S205, the FEC processing unit 135 sets an excess state for the FEC block state in the FEC-block-information table held by the FEC-block-information holding unit 136 and then ends the processing.

When it is determined in step S204 that the number of received packets is not greater than the number of original data packets, the process proceeds to step S206. In step S206, the FEC processor 135 determines whether or not the number of received packets is smaller than the number of original data packets.

When it is determined in step S206 that the number of received packets is smaller than the number of original data packets, the process proceeds to step S207 since the number of FEC packets for recovery of an RTP packet or RTP packets is insufficient. In step S207, the FEC processor 135 sets a shortage state for the FEC block state in the FEC-block-information table held by the FEC-block-information holding unit 136 and then ends the processing.

On the other hand, when it is determined in step S206 that the number of received packets is not smaller than the number of original data packets, the process proceeds to step S208. In step S208, the FEC processor 135 sets an adequate state for the FEC block state in the FEC-block-information table held by the FEC-block-information holding unit 136.

As described above, the FEC processor 135 updates the FEC block state held by the FEC-block-information holding unit 136, every time the reception of the FEC block 171 is completed.

The FEC block state may also be set as a shortage state, without the determination processing in step S206.

Figure 21:
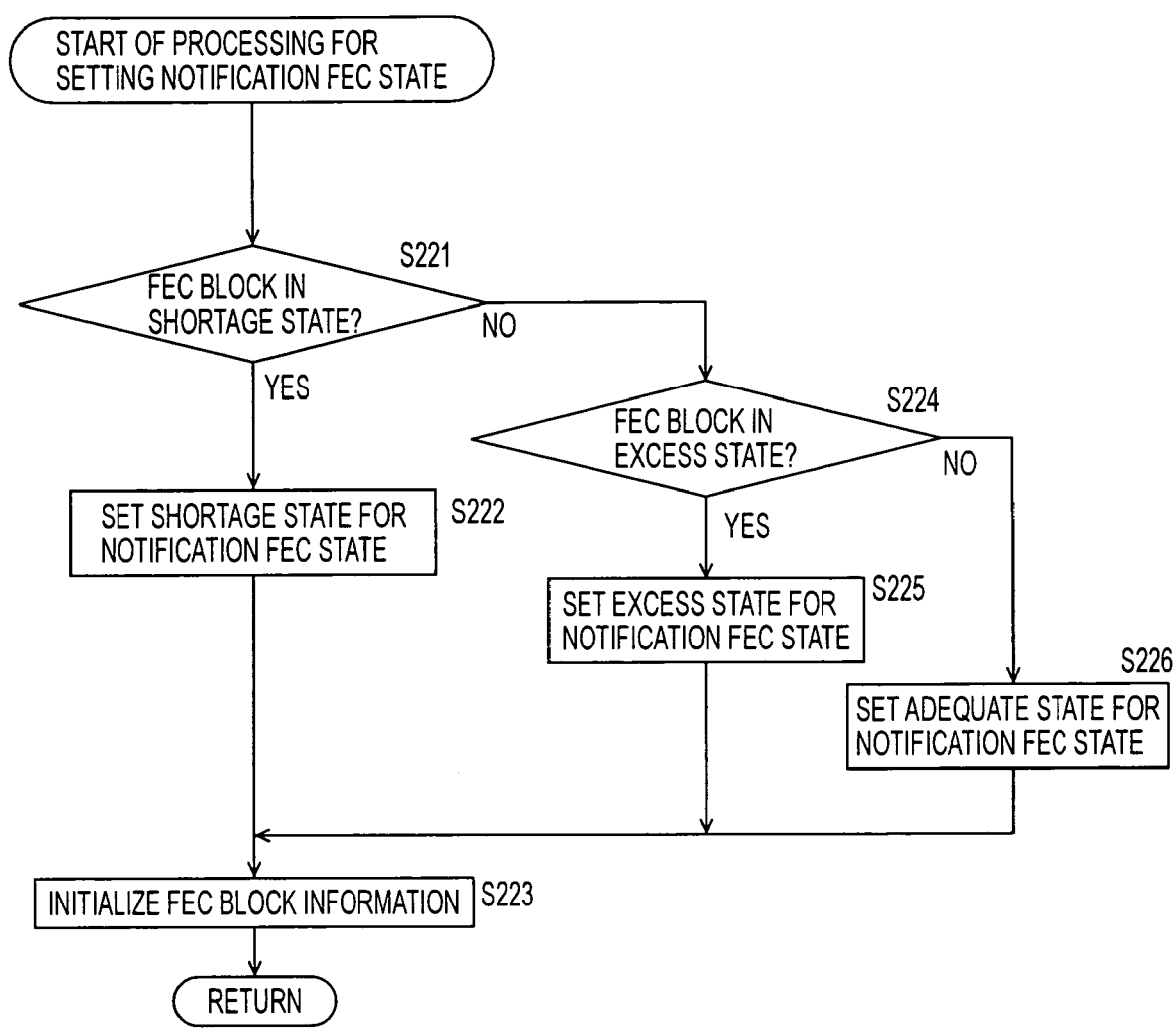
FIG. 21 is a flow chart illustrating processing for setting a notification FEC state.

Next, the processing in step S179 shown in FIG. 18, i.e., the processing for setting the notification FEC block state, is described in detail with reference to a flow chart shown in FIG. 21.

In step S221, the FEC processor 135 determines whether or not an FEC block 171 that is in a shortage state exists out of FEC states for respective FEC block IDs recoded in the FEC-block-information table held by the FEC-block-information holding unit 136.

When it is determined in step S221 that an FEC block 171 that is in a shortage state exists, the process proceeds to step S222. In step S222, the FEC processor 135 sets a shortage state for the notification FEC state held by the notification-FEC-state holding unit 137. In step S223, the FEC processor 135 initializes the FEC block information and ends the processing.

In step S223, the FEC processor 135 initializes the FEC block information, for example, by clearing all FEC block information recorded in the FEC information table.

When it is determined in step S221 that no FEC block 171 that is in a shortage state does not exist out of the FEC states for the respective FEC block IDs recorded in the FEC-block-information table held by the FEC block information holding unit 136, the process proceeds to step S224. In step S224, the FEC processor 135 determines whether or not an FEC block 171 that is in an excess state exists out of the FEC states for the respective FEC block IDs.

When it is determined in step S224 that an FEC block 171 that is in an excess state exists, the process proceeds to step S225. In step S225, the FEC processor 135 sets an excess state for the notification FEC state held by the notification-FEC-state holding unit 137, and the process proceeds to step S223.

When it is determined in step S224 that an FEC block 171 that is in an excess state does not exist, the process proceeds to step S226. In step S226, the FEC processor 135 sets an adequate state for the notification FEC state held by the notification-FEC-state holding unit 137, and the process proceeds to the step S223.

That is, when even one FEC block 171 that is in a shortage state exists out of FEC block states recorded in the FEC-block-information table held by the FEC-block-information holding unit 136, the FEC processor 135 sets a shortage state for the notification FEC state. Further, when all FEC blocks 171 are in an adequate state, the FEC processor 135 sets an adequate state for the notification FEC state. When an FEC block 171 that is in a shortage state does not exist and an FEC block 171 that is in an excess state exists, the FEC processor 135 sets an excess state for the notification FEC state.

As described above, at a predetermined time interval, the FEC processor 135 sets the notification FEC state to be issued to the server 12, based on the FEC block state for each FEC block ID held by the FEC-block-information holding unit 136.

Figure 22:
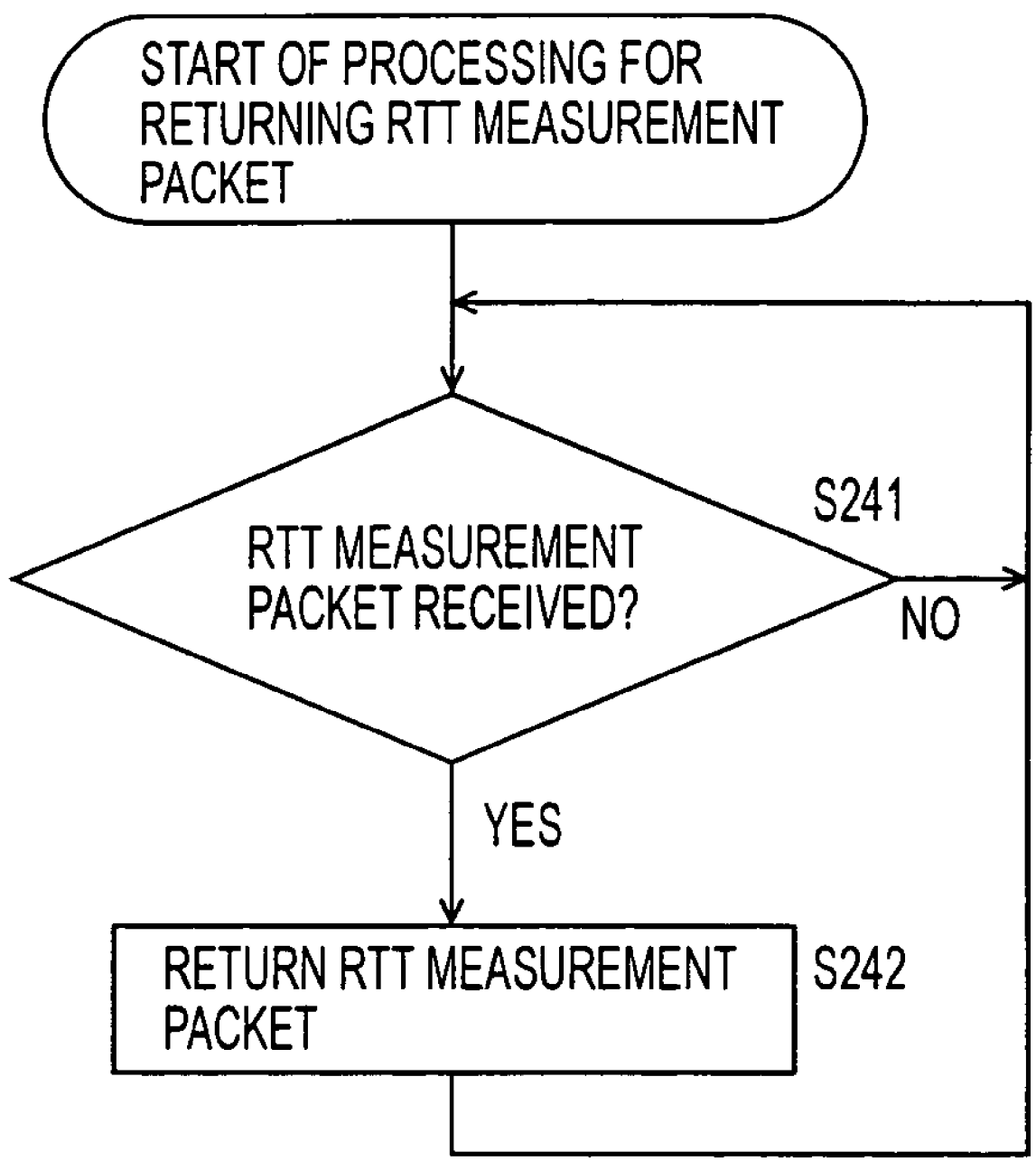
FIG. 22 is a flow chart illustrating processing for returning an RTT measurement packet.

Next, processing for returning an RTT measurement packet is described with reference to FIG. 22. In step S241, when the communication unit 131 receives packets, the RTT measuring unit 138 determines whether or not an RTT measurement packet has been received, based on the packets supplied from the communication unit 131. When it is determined that no RTT measurement packet has been received, the determination processing in step S241 is repeated until when an RTT measurement packet is received.

When it is determined in step S241 that an RTT measurement packet is received, the process proceeds to step S242. In step S242, the RTT measuring unit 138 immediately generates an RTT measurement packet having a data portion that is analogous to the data portion of the received RTT measurement packet and supplies the generated RTT measurement packet to the communication unit 131. The RTT measuring unit 138 then causes the communication unit 131 to immediately transmit the RTT measurement packet to the server 12 over the communications network 13. The process then returns to step S241 and the above-described processing is repeated.

As described above, upon receiving an RTT measurement packet, the client 14 immediately returns an RTT measurement packet to the server 12.

As described above, based on the FEC feedback packet transmitted from the client 14, the server 12 changes the number of FEC packets to be transmitted to the client 14. Further, when the communications network 13 is in a congestion state, the server 12 transmits the FEC packet(s) to the client 14, and when the communications network 13 is not in a congestion state, the server 12 suppresses the transmission of the FEC packet(s) to the client 14. This arrangement can achieve efficient data transmission.

The series of processing described above can be executed by hardware and/or software. When the series of processing is executed by software, a program for implementing the software is installed via a storage medium onto, for example, a computer incorporated in dedicated hardware or onto a general-purpose personal computer that can execute various functions through installation of various programs.

The storage medium for recording the program to be supplied to users may be a package medium that is distributed separately from a computer. As shown in FIG. 5, examples of the package medium include the magnetic disk 51 (including a flexible disk), the optical disk 52 (including CD-ROM (compact disk—read only memory) and a DVD (digital versatile disc), the magneto-optical disk 53 (including MD™ (Mini Disc)), and the semiconductor memory 54. The storage medium for recording the program may also be the ROM (read only memory) 32 or a hard disk (included in the recording unit 38), which is pre-installed in a computer and is supplied to users.

The program for executing the series of processing may also be installed on a computer via an interface, such as a rooter and/or a modem, as needed, or through a wired or wireless communication medium, such as a local area network, the Internet, and/or a digital satellite broadcast network.

Herein, the steps for describing the program stored in such a recording medium may be or may not be processed in a time series according to the sequence described above. Thus, those steps may be processed concurrently or individually.

The system herein refers to an entirety constituted by a plurality of apparatuses.

What is claimed is:

1. A transmission apparatus for transmitting transmission packets containing streaming data over a communications network, the transmission apparatus comprising:
   determining means for determining whether or not the communications network is in a congestion state;
   generating means for generating error correction packets containing error correction data for correcting error of the streaming data; and
   controlling means for controlling the error-correction-packet generation performed by the generating means so as to change the number of error correction packets, when a result of the determination changes from a non-congestion state to a congestion state, wherein
   the determining means determines whether or not the communications network is in a congestion state in accordance with short-range dependent delay time and long-range dependent delay time, the short-range dependent delay time depending on delay time required for transmitting the transmission packets to a receiving side in a period from a first time to a current time and the long-range dependent delay time depending on delay time required for transmitting the transmission packets to the receiving side in a period from a second time to a current time, the second time being earlier than the first time.

2. The transmission apparatus according to claim 1, wherein, when it is determined that the communications network is in a congestion station, the controlling means performs the control so as to cause the generating means to generate a predetermined number of error correction packets, and when it is determined that the communications network is not in a congestion state, the controlling means performs the control so as to suppress the error-correction-packet generation performed by the generating means.

3. The transmission apparatus according to claim 1, wherein, when the result of the determination changes from a non-congestion state to a congestion state, the controlling means performs the control so as to change the number of error correction packets, in accordance with a reception state of the transmission packets in an immediately previous congestion state.

4. The transmission apparatus according to claim 1, wherein at least one of the transmission packets defines one error correction unit in a predetermined period of time and, when the number of error correction packets in one or more of the error correction units is determined to be insufficient in the predetermined period of time in accordance with a state of reception of the one or more error correction units in the predetermined period of time, the controlling means performs the control so as to increase the number of error correction packets.

5. A method for transmitting transmission packets containing streaming data over a communications network, the method comprising:
   determining whether or not the communications network is in a congestion state;
   generating error correction packets containing error correction data for correcting error of the streaming data; and
   controlling the error-correction-packet generation performed by the generating so as to change the number of error correction packets, when a result of the determination changes from a non-congestion state to a congestion state, wherein
   the determining determines whether or not the communications network is in a congestion state in accordance with short-range dependent delay time and long-range dependent delay time, the short-range dependent delay time depending on delay time required for transmitting the transmission packets to a receiving side in a period from a first time to a current time and the long-range dependent delay time depending on delay time required for transmitting the transmission packets to the receiving side in a period from a second time to a current time, the second time being earlier than the first time.

6. The method according to claim 5, wherein, when it is determined that the communications network is in a congestion station, the controlling performs the control so as to cause the generating to generate a predetermined number of error correction packets, and when it is determined that the communications network is not in a congestion state, the controlling performs the control so as to suppress the error-correction-packet generation performed by the generating.

7. The method according to claim 5, wherein, when the result of the determination changes from a non-congestion state to a congestion state, the controlling performs the control so as to change the number of error correction packets, in accordance with a reception state of the transmission packets in an immediately previous congestion state.

8. The method according to claim 5, wherein at least one of the transmission packets defines one error correction unit in a predetermined period of time and, when the number of error correction packets in one or more of the error correction units is determined to be insufficient in the predetermined period of time in accordance with a state of reception of the one or more error correction units in the predetermined period of time, the controlling performs the control so as to increase the number of error correction packets.

9. A computer readable tangible storage medium encoded with a computer readable program configured to cause an information processing apparatus to execute a method, the method comprising:
  determining whether or not the communications network is in a congestion state;
  generating error correction packets containing error correction data for correcting error of the streaming data; and
  controlling the error-correction-packet generation performed by the generating so as to change the number of error correction packets, when a result of the determination changes from a non-congestion state to a congestion state, wherein
  the determining determines whether or not the communications network is in a congestion state in accordance with short-range dependent delay time and long-range dependent delay time, the short-range dependent delay time depending on delay time required for transmitting the transmission packets to a receiving side in a period from a first time to a current time and the long-range dependent delay time depending on delay time required for transmitting the transmission packets to the receiving side in a period from a second time to a current time, the second time being earlier than the first time.

10. The storage medium according to claim 9, wherein, when it is determined that the communications network is in a congestion station, the controlling performs the control so as to cause the generating to generate a predetermined number of error correction packets, and when it is determined that the communications network is not in a congestion state, the controlling performs the control so as to suppress the error-correction-packet generation performed by the generating.

11. The storage medium according to claim 9, wherein, when the result of the determination changes from a non-congestion state to a congestion state, the controlling performs the control so as to change the number of error correction packets, in accordance with a reception state of the transmission packets in an immediately previous congestion state.

12. The storage medium according to claim 9, wherein at least one of the transmission packets defines one error correction unit in a predetermined period of time and, when the number of error correction packets in one or more of the error correction units is determined to be insufficient in the predetermined period of time in accordance with a state of reception of the one or more error correction units in the predetermined period of time, the controlling performs the control so as to increase the number of error correction packets.

* * * * *